(12) United States Patent
Kim

(10) Patent No.: US 12,543,303 B2
(45) Date of Patent: Feb. 3, 2026

(54) SEMICONDUCTOR MEMORY DEVICE

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 436 days.

(21) Appl. No.: 17/536,872

(22) Filed: Nov. 29, 2021

(65) Prior Publication Data
US 2022/0399340 A1 Dec. 15, 2022

(30) Foreign Application Priority Data

Jun. 10, 2021 (KR) .................. 10-2021-0075555

(51) Int. Cl.
H10B 12/00 (2023.01)
H10D 30/67 (2025.01)
(Continued)

(52) U.S. Cl.
CPC ............. *H10B 12/30* (2023.02); *H10B 12/01* (2023.02); *H10D 30/6713* (2025.01);
(Continued)

(58) Field of Classification Search
CPC ........ H10B 12/01; H10B 12/30; H10B 12/48; H10B 12/488; H01L 29/42392; H01L 29/78672; H01L 29/7869; H01L 29/511; H01L 29/513; H01L 27/0688; H01L 21/823437; H01L 21/82345; H01L 21/823456; H10D 30/6735; H10D 30/501;
(Continued)

(56) References Cited

U.S. PATENT DOCUMENTS

2015/0072490 A1 3/2015 Doyle et al.
2015/0263167 A1 9/2015 Miyata
(Continued)

FOREIGN PATENT DOCUMENTS

CN 108389896 B 12/2020
CN 106663694 B 5/2021
(Continued)

OTHER PUBLICATIONS

Office Action for Korean Patent Application No. 10-2021-0075555 issued by the Korean Patent Office on Apr. 21, 2025.

*Primary Examiner* — Joshua Benitez Rosario
*Assistant Examiner* — John Lin
(74) *Attorney, Agent, or Firm* — IP&T GROUP LLP

(57) ABSTRACT

A semiconductor memory device and method for making the same. The semiconductor memory device includes an active layer spaced apart from a substrate, extending in a direction parallel to the substrate, and including a channel; a bit line extending in a vertical direction to the substrate and contacting a first end portion of the active layer; a capacitor contacting a second end portion of the active layer; a word line including a high work function electrode adjacent to the bit line and a low work function electrode adjacent to the capacitor; a first gate dielectric layer disposed between the low work function electrode and the active layer; and a second gate dielectric layer disposed between the high work function electrode and the active layer, the second gate dielectric layer being thinner than the first gate dielectric layer.

24 Claims, 24 Drawing Sheets

(51) Int. Cl.
*H10D 64/68* (2025.01)
*H10D 84/01* (2025.01)

(52) U.S. Cl.
CPC ..... *H10D 30/6735* (2025.01); *H10D 30/6745* (2025.01); *H10D 30/6755* (2025.01)

(58) Field of Classification Search
CPC ........... H10D 30/6745; H10D 30/6755; H10D 88/00; H10D 64/681; H10D 64/685; H10D 84/0135; H10D 84/014; H10D 84/0142
See application file for complete search history.

(56) References Cited

U.S. PATENT DOCUMENTS

| | | | | |
|---|---|---|---|---|
| 2016/0172488 | A1* | 6/2016 | Oh | H10D 30/63 |
| | | | | 257/330 |
| 2018/0323199 | A1* | 11/2018 | Roberts | H10D 64/518 |
| 2020/0259018 | A1* | 8/2020 | Rami | H10D 30/43 |
| 2021/0183862 | A1* | 6/2021 | Son | H01L 21/28518 |
| 2022/0358971 | A1* | 11/2022 | Lee | G11C 5/10 |
| 2023/0033086 | A1* | 2/2023 | Wang | H10B 41/35 |

FOREIGN PATENT DOCUMENTS

| | | |
|---|---|---|
| CN | 115472609 B | 8/2024 |
| KR | 10-2019-0038223 A | 4/2019 |
| KR | 10-2020-0105216 A | 9/2020 |
| KR | 10-2021-0050630 A | 5/2021 |

\* cited by examiner

SEMICONDUCTOR MEMORY DEVICE

CROSS-REFERENCE TO RELATED APPLICATIONS

The present application claims priority to Korean Patent Application No. 10-2021-0075555, filed on Jun. 10, 2021, which is incorporated herein by reference in its entirety.

BACKGROUND

1. Field

Various embodiments of the present invention relate to a semiconductor device and, more particularly, to a semiconductor device including a three-dimensional memory cell.

2. Description of the Related Art

Integration degree of two-dimensional semiconductor memory devices is mainly determined by the area occupied by unit memory cells. Thus, the integration degree is mainly affected by the level of a fine-pattern fabrication technology. The integration degree of two-dimensional semiconductor memory devices is still increasing, but the increase is limited because fabricating finer patterns requires highly expensive tools. Accordingly, three-dimensional (3D) semiconductor memory devices having three-dimensionally arranged memory cells are being suggested.

SUMMARY

Various embodiments of the present invention provide semiconductor memory device(s) including highly integrated memory cells.

In accordance with one embodiment of the present invention, a semiconductor memory device may comprise: an active layer spaced apart from a substrate, extending in a direction parallel to the substrate, and including a channel; a bit line extending in a vertical direction to the substrate and contacting a first end portion of the active layer; a capacitor contacting a second end portion of the active layer; a word line including a high work function electrode which is adjacent to the bit line and a low work function electrode which is adjacent to the capacitor, the low work function electrode having a lower work function than the high work function electrode; a first gate dielectric layer disposed between the low work function electrode and the active layer; and a second gate dielectric layer disposed between the high work function electrode and the active layer, the second gate dielectric layer being thinner than the first gate dielectric layer.

In accordance with another embodiment of the present invention, a method for fabricating a semiconductor memory device may comprise: forming a stack body of a first inter-level dielectric layer, a first sacrificial layer, a semiconductor layer, a second sacrificial layer, and a second inter-level dielectric layer which are sequentially stacked; forming a first opening penetrating the stack body; forming recesses by removing the first sacrificial layer and the second sacrificial layer through the first opening; thinning the semiconductor layer exposed by the recesses; forming a first gate dielectric layer on the thinned semiconductor layer; forming a low work function electrode on the first gate dielectric layer; forming a second gate dielectric layer by thinning a portion of the first gate dielectric layer; and forming a high work function electrode on the second gate dielectric layer, the high work function electrode contacting the low work function electrode.

In one embodiment, the present invention may improve the gate induced drain leakage (GIDL) by forming a thick gate dielectric layer between the low work function electrode and the active layer.

In one embodiment, the present invention may increase the operating current IOP by forming a thin gate dielectric layer between the high work function electrode and the active layer.

In one embodiment, the present invention may realize low power consumption while securing refresh characteristics of the memory cell because the word line has a dual work function electrode structure including a low work function electrode and a high work function electrode.

In one embodiment, the present invention may realize the high integration of memory cells including a thin-body channel by forming a double word line having a dual work function electrode structure.

DETAILED DESCRIPTION

Figure 1:
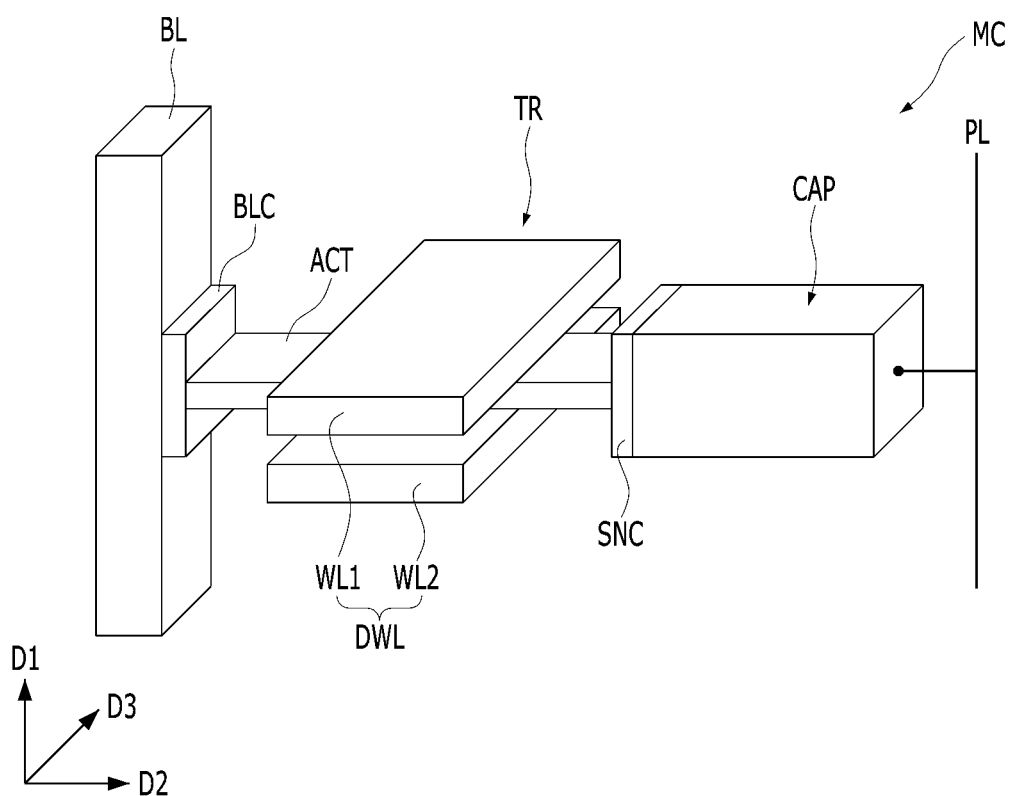
FIG. 1 is a schematic perspective view illustrating a memory cell of a semiconductor memory device according to one embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Embodiments described below may increase the memory cell density and decrease parasitic capacitance by vertically stacking memory cells.

Embodiments described below relate to a three-dimensional Dynamic Random-Access Memory (3D DRAM) and may have a word line including a low work function electrode and a high work function electrode. The low work function electrode may be adjacent to the capacitor, and the high work function electrode may be adjacent to the bit line. The low work function electrode may include polysilicon, and the high work function electrode may include a metal-base material.

Low electric fields may be formed between the word line and the capacitor due to the low work function of the low work function electrode. Therefore, the leakage current may be improved.

The high work function of the high work function electrode may not only help in forming a high threshold voltage, but also may lower the height of the memory cell by forming a relatively low electric field. These attributes are advantageous in terms of integration.

Figure 2:
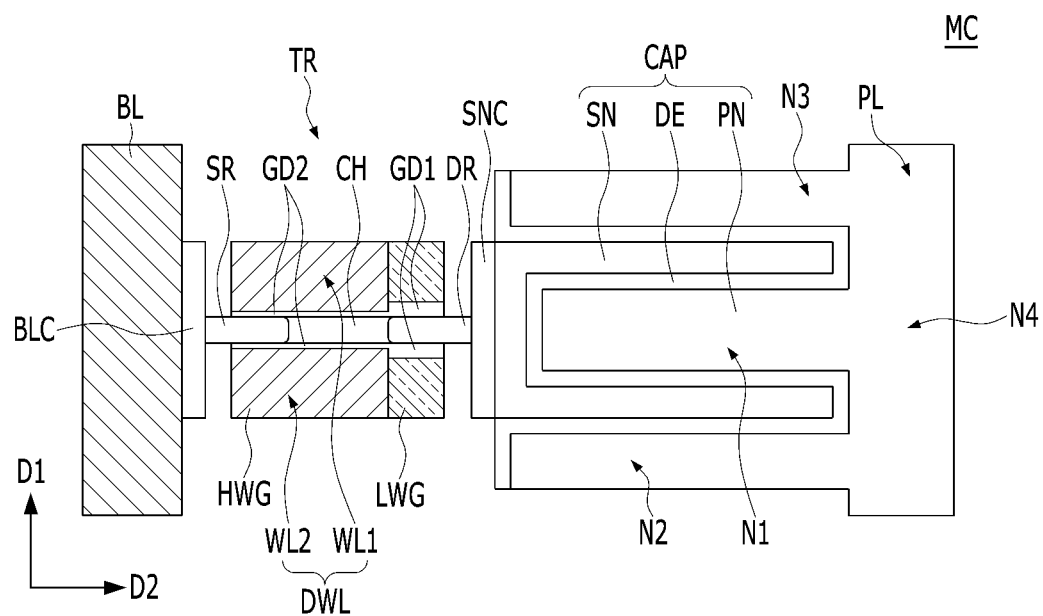
FIG. 2 is a cross-sectional view illustrating the memory cell of FIG. 1.

FIG. 1 is a schematic perspective view illustrating a memory cell of a semiconductor memory device according to one embodiment of the present invention. FIG. 2 is a cross-sectional view illustrating the memory cell of FIG. 1.

Referring to FIGS. 1 and 2, a memory cell MC may include a bit line BL, a transistor TR, and a capacitor CAP. The transistor TR may include an active layer ACT, gate dielectric layers GD1 and GD2, and a double word line DWL (WL1, WL2). The capacitor CAP may include a storage node SN, a dielectric layer DE, and a plate node PN. The bit line BL may have a pillar shape extending in a first direction D1. The active layer ACT may have a bar shape extending in a second direction D2 which intersects with the first direction D1. The double word line DWL may have a line shape extending in a third direction D3 which intersects with both the first direction D1 and the second direction D2. The plate node PN of the capacitor CAP may be connected to a plate line PL.

The bit line BL may be vertically oriented along the first direction D1. The bit line BL may be referred to as a vertically oriented bit line or a pillar shape bit line. The bit line BL may include a conductive material. The bit line BL may include a silicon-base material, a metal-base material, or a combination thereof. The bit line BL may include for example polysilicon, metal, metal nitride, metal silicide, or a combination thereof. Vertically stacked memory cells MC may share a single bit line BL. The bit line BL may include polysilicon, metal, titanium nitride, tungsten, or a combination thereof. For example, the bit line BL may include polysilicon doped with an N-type impurity or titanium nitride (TiN). The bit line BL may include a stack of titanium nitride and tungsten (TiN/W).

The double word line DWL may be elongated in the third direction D3, and the active layer ACT may extend in the second direction D2. The active layer ACT may be laterally arranged from the bit line BL. The double word line DWL may include a first word line WL1 and a second word line WL2. The first and second word lines WL1 and WL2 may face each other with the active layer ACT interposed therebetween. The gate dielectric layers GD1 and GD2 may be formed on the upper and lower surfaces of the active layer ACT.

The active layer ACT may include a semiconductor material. For example, the active layer ACT may include silicon, germanium, or silicon-germanium. The active layer ACT may include a channel CH, a first source/drain region SR between the channel CH and the bit line BL, and a second source/drain region DR between the channel CH and the capacitor CAP. In another embodiment, the active layer ACT may include an oxide semiconductor material. For example, the oxide semiconductor material may include IGZO (Indium Gallium Zinc Oxide). The channel CH may be formed of an oxide semiconductor material, and the first and second source drain regions SR and DR may be omitted when the active layer ACT is formed of an oxide semiconductor material.

The first source/drain region SR and the second source/drain region DR may be doped with impurities with the same conductive type. The first source/drain region SR and the second source/drain region DR may be doped with an N-type impurity or a P-type impurity. The first source/drain region SR and the second source/drain region DR may include at least any one impurity selected from among arsenic (AS), phosphorus (P), boron (B), indium (In), and a combination thereof. A first side of the first source/drain region SR may contact the bit line BL, and a second side of the first source/drain region SR may contact the channel CH. A first side of the second source/drain region DR may contact the storage node SN, and a second side of the second source/drain region DR may contact the channel CH. The second sides of the first source/drain region SR and the second source/drain region DR may each partially overlap with sides of the first and second word lines WL1 and WL2. A lateral length of the channel CH along the second direction D2 may be shorter than lateral lengths of the first and second source/drain regions SR and DR along the second direction D2. In another embodiment, the lateral length of the channel CH along the second direction D2 may be longer than the lateral lengths of the first and second source/drain regions SR and DR along the second direction D2.

The transistor TR, as a cell-transistor, may have the double word line DWL. In the double word line DWL, the first word line WL1 and the second word line WL2 may have the same electric potential. For example, the first and second word lines WL1 and WL2 may form a pair and couple to one memory cell MC. The same word line driving voltage may be applied to the first and second word lines WL1 and WL2. Accordingly, the memory cell MC according to one embodiment of the present invention may include the double word line DWL in which the first and second word lines WL1 and WL2 are disposed adjacent to one channel CH.

The active layer ACT may have a thickness smaller than thicknesses of the first and second word lines WL1 and WL2. Specifically, the vertical thickness of the active layer ACT along the first direction D1 may be smaller than each of the vertical thicknesses of the first and second word lines WL1 and WL2 along the first direction D1.

The active layer ACT having a small thickness is referred to hereinafter as a thin-body active layer. The active layer ACT may include a thin channel CH. The channel CH is referred to as "thin-body channel CH" hereinafter. A thickness V2 of the thin-body channel CH may be less than 10 nm. In another embodiment, the thin-body channel CH may have the same vertical thickness as the first and second word lines WL1 and WL2.

The upper and lower surfaces of the active layer ACT may have a flat surface. That is, the upper and lower surfaces of the active layer ACT may be parallel to each other along the second direction D2.

The gate dielectric layers GD1 and GD2 may include for example silicon oxide, silicon nitride, metal oxide, metal oxynitride, metal silicate, a high-k material, a ferroelectric material, an anti-ferroelectric material, or a combination thereof. The gate dielectric layers GD1 and GD2 may include for example $SiO_2$, $Si_3N_4$, $HfO_2$, $Al_2O_3$, $ZrO_2$, AlON, HfON, HfSiO, HfSiON, or a combination thereof.

The double word line DWL may include metal, metal mixture, metal alloy, or a semiconductor material. The double word line DWL may include for example titanium nitride, tungsten, polysilicon, or a combination thereof. For example, the double word line DWL may include a TiN/W stack in which titanium nitride and tungsten are sequentially stacked in the recited order. The double word line DWL may include an N-type work function material or a P-type work function material. The N-type work function material may have a low work function of 4.5 eV or less. The P-type work function material may have a high work function of 4.5 eV or more.

In one embodiment of the present invention, the double word line DWL may include a pair of the first and second word lines WL1 and WL2 with the active layer ACT interposed therebetween. The double word line DWL may be coupled to a memory cell MC.

In one embodiment, each of the first and second word lines WL1 and WL2 may include a low work function electrode LWG and a high work function electrode HWG. The low work function electrode LWG and the high work function electrode HWG may be laterally positioned along the second direction D2. The low work function electrode LWG may be disposed adjacent to the second source/drain region DR. The high work function electrode HWG may be disposed adjacent to the first source/drain region SR. The low work function electrode LWG and the high work function electrode HWG are formed of different work function materials. The high work function electrode HWG may have a higher work function than the low work function electrode LWG. The high work function electrode HWG may include a high work function material. The high work function electrode HWG may have a higher work function than the mid-gap work function of silicon (e.g., 4.5 eV). The low work function electrode LWG may include a low work function material. The low work function electrode LWG may have lower work function than the mid-gap work function of silicon. In other words, the high work function material may have a work function higher than 4.5 eV, and the low work function material may have a work function lower than 4.5 eV. The low work function electrode LWG may include polysilicon doped with an N-type dopant. The high work function electrode HWG may include a metal-base material. The high work function electrode HWG may include for example tungsten, titanium nitride, or a combination thereof. A barrier material may be further formed between the low work function electrode LWG and the high work function electrode HWG.

In one embodiment, a width of the high work function electrode HWG in the second direction D2 may be greater than a width of the low work function electrode LWG in the second direction D2. A thickness of the high work function electrode HWG in the first direction D1 may be greater than a thickness of the low work function electrode LWG in the first direction D1. In one embodiment, the high work function electrode HWG may have a greater volume than the low work function electrode LWG. Therefore, the first and second word lines WL1 and WL2 may have low resistivity.

The high work function electrode HWG and the low work function electrode LWG may vertically overlap with the active layer ACT along the first direction D1. An overlap area between the high work function electrode HWG and the active layer ACT may be greater than an overlap area between the low work function electrode LWG and the active layer ACT. For example, the high work function electrode HWG may vertically overlap with the thin-body channel CH along the first direction D1. The high work function electrode HWG may vertically overlap with the first source/drain region SR along the first direction D1. The low work function electrode LWG may vertically overlap with the thin-body channel CH along the first direction D1. An overlap area between the high work function electrode HWG and the thin-body channel CH may be greater than an overlap area between the low work function electrode LWG and the second source/drain region DR. The low work function electrode LWG and the high work function electrode HWG may extend in parallel, and the low work function electrode LWG and the high work function electrode HWG may directly contact each other.

As described above, each of the first and second word lines WL1 and WL2 may have a dual work function electrode structure which includes the low work function electrode LWG and the high work function electrode HWG. More specifically, the double word line DWL may have a pair of dual work function electrodes extending in the third direction D3 crossing the thin-body channel CH with the thin-body channel CH interposed therebetween. The pair of the dual work function electrodes may refer to a pair of the first word line WL1 and the second word line WL2.

A bit line contact node BLC may be formed between the first source/drain region SR and the bit line BL. The bit line contact node BLC may have a height fully covering a side of the first source/drain region SR. The bit line contact node BLC may include polysilicon. For example, the bit line contact node BLC may include polysilicon doped with an impurity. The impurity may have the same conductive type as the impurity of the first source/drain region SR.

The capacitor CAP may be laterally disposed from the transistor TR in the second direction D2. The capacitor CAP may include the storage node SN which laterally extends from the active layer ACT in the second direction D2. The capacitor CAP may further include the dielectric layer DE, the plate node PN, and the storage node SN. The storage node SN, the dielectric layer DE, and the plate node PN may be laterally arranged in the second direction D2. The storage node SN may have a laterally oriented cylinder-shape. The dielectric layer DE may conformally cover a cylindrical inner wall and a cylindrical outer wall of the storage node SN. The plate node PN may have a shape extended in the cylindrical inner wall and the cylindrical outer wall of the storage node SN on the dielectric layer DE. The plate node PN may be connected to the plate line PL. The storage node SN may be electrically connected to the second source/drain region DR.

The storage node SN may have a 3D structure which is laterally oriented along the second direction D2. As an example of the 3D structure, the storage node SN may have a cylindrical shape. In another embodiment, the storage node SN may have a pillar shape or a "pylinder" shape. A pylinder shape refers to a structure in which a pillar shape and a cylinder shape are merged. Referring to the orientation shown in FIG. 2, the uppermost surface of the storage node SN may be at the same level with the top surface of the first word line WL1. Referring to the orientation shown in FIG. 2, the lowermost surface of the storage node SN may be at the same level as the bottom surface of the second word line WL2.

The plate node PN may include an inner node N1 and outer nodes N2, N3, and N4. The inner node N1 and the outer nodes N2 to N4 may be interconnected. The inner node N1 may be disposed inside the cylinder of the storage node SN. The outer nodes N2 and N3 may be disposed outside the cylinder of the storage node SN with the dielectric layer DE interposed therebetween. The outer node N4 may interconnect the inner node N1 and the outer nodes N2 and N3. The outer nodes N2 and N3 may be disposed to surround the cylinder outer wall of the storage node SN. The outer node N4 may serve as the plate line PL.

The storage node SN and the plate node PN may include metal, noble metal, metal nitride, conductive metal oxide, conductive noble metal oxide, metallic carbide, metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-base material and a silicon-base material. For example, the plate node PN may be formed of a titanium nitride/silicon germanium/tungsten nitride (TiN/SiGe/WN) stack. In the titanium nitride/silicon germanium/tungsten nitride (TiN/SiGe/WN) stack, silicon germanium (SiGe) may be a gap-fill material filling inside the cylinder of the storage node SN, titanium nitride (TiN) may serve as the plate node PN of the capacitor CAP, and tungsten nitride (WN) may be a low-resistivity material.

The dielectric layer DE may include silicon oxide, silicon nitride, a high-k material, or a combination thereof. A high-k material may have a higher dielectric constant than silicon oxide. Silicon oxide ($SiO_2$) may have a dielectric constant of about 3.9, and the dielectric layer DE may include a high-K material having a dielectric constant of 4 or more. A high-k material may have a dielectric constant of about 20 or more. A high-k material may include for example hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the high-k materials mentioned above.

The dielectric layer DE may be formed of a zirconium (Zr)-base oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked in the recited order. The ZA and ZAZ stacks may be referred to as a zirconium oxide ($ZrO_2$)-base layer. In another embodiment, the dielectric layer DE may be formed of hafnium (Hf)-base oxide. The dielectric layer DE may have a stack structure including hafnium oxide ($HfO_2$). The stack structure including hafnium oxide ($HfO_2$) may include a HA ($HfO_2/Al_2O_3$) stack or a HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked in this order. The HA and HAH stacks may be referred to as a hafnium oxide ($HfO_2$)-base layer. Aluminum oxide ($Al_2O_3$) may have a greater band gap than zirconium oxide ($ZrO_2$) and hafnium oxide ($HfO_2$) in the ZA, ZAZ, HA, and HAH stacks. Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band gap material, with the high band gap material having a greater band gap than the high-k material. The dielectric layer DE may include silicon oxide ($SiO_2$) as a high band gap material other than aluminum oxide ($Al_2O_3$). Since the dielectric layer DE includes a high band gap material, leakage current may be suppressed. The high band gap material may be thinner than the high-k material. In another embodiment, the dielectric layer DE may include a laminated structure in which a high-k material and a high band gap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the laminated structures like above, aluminum oxide ($Al_2O_3$) may be thinner than zirconium oxide and hafnium oxide.

In another embodiment, the dielectric layer DE may include a stack structure, a laminated structure, or an intermixing structure including zirconium oxide, hafnium oxide, and aluminum oxide.

In another embodiment, the dielectric layer DE may include a ferroelectric material or an anti-ferroelectric material.

In another embodiment, an interface control layer may be formed between the storage node SN and the dielectric layer DE to improve leakage current. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-base material.

The capacitor CAP may be replaced with other data saving materials. For example, data saving materials may include a phase change material, a magnetic tunnel junction (MTJ) material, or a variable resistor material.

A storage contact node SNC may be formed between the second source/drain region DR and the storage node SN. The storage contact node SNC may have a height fully covering a side of the second source/drain region DR. The storage contact node SNC may include polysilicon. For example, the storage contact node SNC may include polysilicon doped with an impurity. The impurity used for doping the polysilicon may have the same conductive type as the impurity of the first source/drain region SR.

In one embodiment, the first gate dielectric layer GD1 may be formed between the low work function electrode LWG and the active layer ACT, and the second gate dielectric layer GD2 may be formed between the high work function electrode HWG and the active layer ACT. The first gate dielectric layer GD1 may be thicker than the second gate dielectric layer GD2. As a thickness of the first gate dielectric layer GD1 increases, the gate-induced drain leakage (GILD) may be improved. As a thickness of the second gate dielectric layer GD2 decreases, the operating current (IOP) may be increased.

As described above, the memory cell MC may include a double word line DWL having the structure of a pair of dual work function electrodes. The first and second word lines WL1 and WL2 of the double word line DWL may each include the low work function electrode LWG and the high work function electrode HWG. The low work function electrode LWG may be disposed adjacent to the capacitor CAP, and the high work function electrode HWG may be disposed adjacent to the bit line BL. A relatively low strength electric field (referred to hereinafter as a "low electric field") may be formed between the double word line DWL and the capacitor CAP due to the low work function of the low work function electrode LWG. Therefore, the leakage current may be improved. The high work function of the high work function electrode HWG not only may help form a high threshold voltage of the transistor TR, but also may lower the height of the memory cell by forming the low electric field. With the high work function of the high work function electrode HWG, a high threshold voltage of the transistor TR may be formed, and the height of the memory cell MC may be reduced because of the low electric field. The reduction in height is advantageous in terms of integration degree.

In comparative example 1, the first and second word lines WL1 and WL2 are formed only of the metal-base material. The metal-base material forms a relatively high strength electric field (referred to hereinafter as a "high electric field") between the first and second word lines WL1 and WL2 and the capacitor CAP, thereby deteriorating the leakage current of the memory cell. The deterioration of the leakage current due to such a high electric field worsens as the channel CH becomes thinner.

In comparative example 2, the first and the second word lines WL1 and WL2 are formed only of the low work function material. The low work function reduces the threshold voltage of a transistor, thereby generating a leakage current.

In one embodiment of the present invention, the first and second word lines WL1 and WL2 of the double word line DWL have the structure of dual work function electrodes. Thus, the leakage current may be improved, and low power consumption may be possible by securing the refresh characteristics of the memory cell.

In this embodiment, it is advantageous to increase the electric field because the first and second word lines WL1 and WL2 of the double word line DWL have a dual work function electrode structure. Thus, a high number of stackings may be realized even if the thickness of the channel CH is reduced for high integration.

Figure 3:
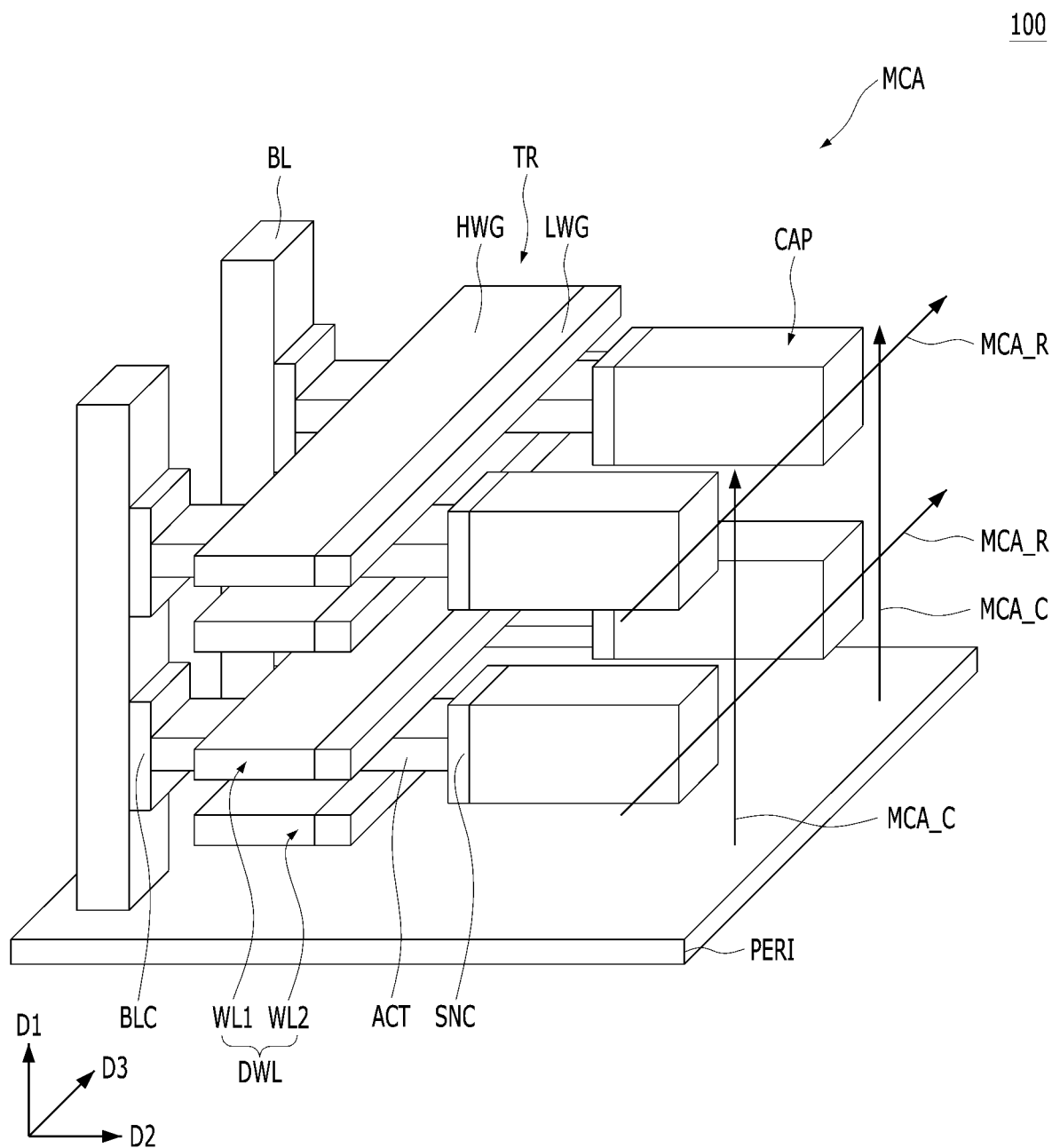
FIG. 3 is a schematic perspective view illustrating a semiconductor memory device according to another embodiment of the present invention.
Figure 4:
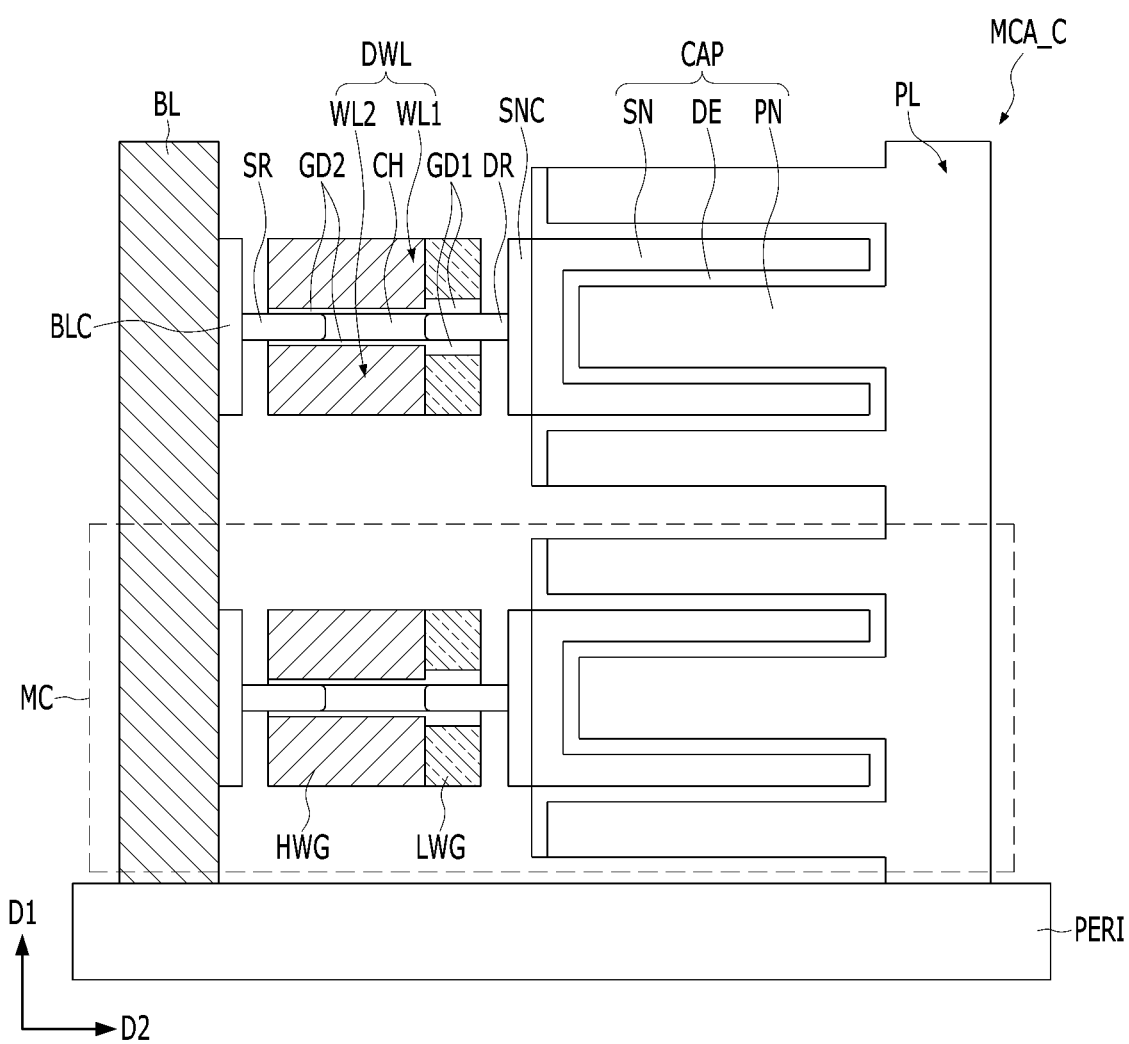
FIG. 4 is a cross-sectional view illustrating a vertical memory cell array MCA_C of FIG. 3.
Figure 5:
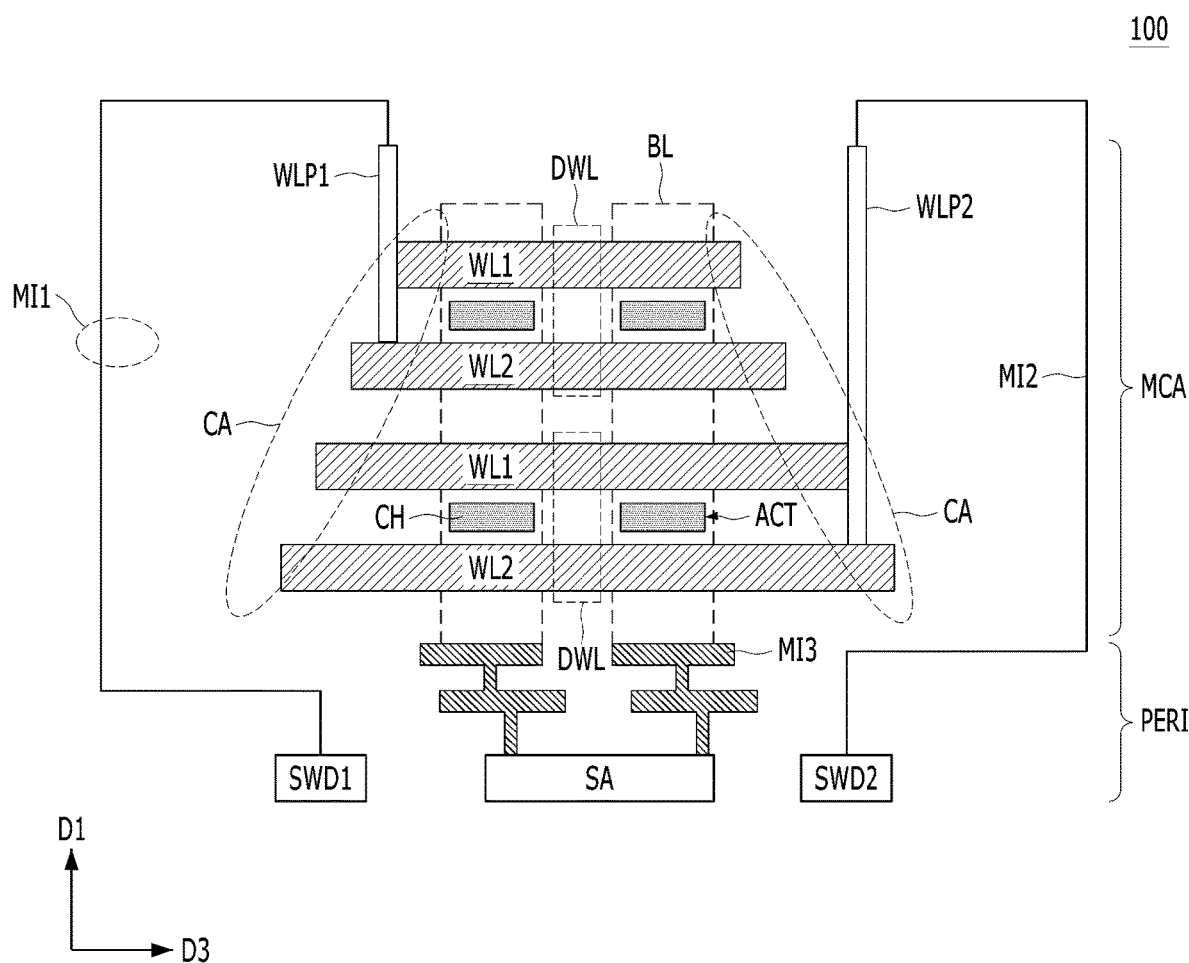
FIG. 5 is a cross-sectional view illustrating edge portions of word lines.

FIG. 3 is a schematic perspective view illustrating a semiconductor memory device according to another embodiment of the present invention. FIG. 4 is a cross-sectional view illustrating the vertical memory cell array MCA-C of FIG. 3. FIG. 5 is a cross-sectional view illustrating edge portions of the double word lines.

Referring to FIGS. 3 to 5, a semiconductor memory device 100 may include a memory cell array MCA. Multiple memory cells composed of memory cell MC of FIG. 1 may be arranged in the first to third directions D1, D2, and D3 and configure the memory cell array MCA of a multi-layer structure. The memory cell array MCA may form a 3D memory cell array of memory cells MC. The 3D memory cell array may include a vertical memory cell array MCA_C and a lateral memory cell array MCA_R. A vertical memory cell array MCA_C refers to an array of the memory cells MC vertically arranged along the first direction D1. A lateral memory cell array MCA_R refers to an array of the memory cells MC laterally arranged along the third direction D3. The vertical memory cell array MCA_C may be referred to as a column array of the memory cells MC, and the lateral memory cell array MCA_R may be referred to as a row array of the memory cells MC. The bit line BL may be vertically oriented to be connected to the vertical memory cell array MCA_C. The double word line DWL may be laterally oriented to be connected to the lateral memory cell array MCA_R. A bit line BL connected to the vertical memory cell array MCA_C is referred to hereinafter as a common bit line BL. Neighboring vertical memory cell arrays MCA_C, disposed along the third direction D3, may be connected to different common bit lines. A double word line DWL connected to a lateral memory cell array MCA_R is referred to hereinafter as a common double word line DWL. Neighboring lateral memory cell arrays MCA_R, disposed along the first direction D1, may be connected to different common double word lines.

The memory cell array MCA may include a plurality of the memory cells MC. Each of the memory cells MC may include a vertically oriented bit line BL, a laterally oriented active layer ACT, a double word line DWL, and a laterally oriented capacitor CAP. FIG. 3 illustrates a 3D memory cell array composed of four memory cells MC.

A single bit line BL may be connected by neighboring active layers ACT which are adjacent to each other along the first direction D1. The active layers ACT which are adjacent to each other along the third direction D3 may share one double word line DWL. Each capacitor CAP may be connected to a respective active layer ACT. The capacitors CAP may share a single plate line PL. A single active layer ACT may be thinner than the first and second word lines WL1 and WL2 of the double word line DWL.

In the memory cell array MCA shown in FIG. 3, two double word lines DWL are vertically stacked along the first direction D1. Each of the double word lines DWL includes a pair of the first and second word lines WL1 and WL2. Between the first and second word lines WL1 and WL2, a plurality of the active layers ACT are laterally arranged along the second direction D2 and spaced apart from each other. The thin-body channel CH of the active layer ACT is disposed between the first word line WL and the second word line WL2.

The first and second word lines WL1 and WL2 of the double word line DWL may each include a low work function electrode LWG and a high work function electrode HWG. The low work function electrodes LWG may be disposed adjacent to the capacitor CAP, and the high work function electrodes HWG may be disposed adjacent to the bit line BL.

Referring to FIG. 5 again, each of the double word lines DWL may include edge portions on both sides. The edge portions may form a step shape, and the step shape may define contact portions CA. The first and second word lines WL1 and WL2 may each include edge portions on both sides, that is, the contact portions. The contact portions CA may each have a step shape.

Each of the contact portions CA may be connected to a plurality of word line pads WLP1 and WLP2. The first word line pad WLP1 may be connected to the upper-level double word line DWL, for example, the contact portions CA of the first word line WL1 and the second word line WL2 at the upper level. The second word line pad WLP2 may be connected to the lower-level double word line DWL, for example, the contact portions CA of the first word line WL1 and the second word lines WL2 at the lower level. The first word line WL1 and the second word line WL2 at the upper level may be interconnected by the first word line pad WLP1. The first word line WL1 and the second word line WL2 at the lower level may be interconnected by the second word line pad WLP2.

The semiconductor memory device 100 may further include a substrate PERI. The substrate PERI may further include a peripheral circuit portion. Hereinafter, the substrate PERI is abbreviated as a peripheral circuit region PERI. The bit line BL of the memory cell array MCA may be vertically oriented with respect to the surface of the peripheral circuit portion PERI along the first direction D1. The double word line DWL may be laterally oriented with respect to the surface of the peripheral circuit portion along the third direction D3.

The peripheral circuit portion PERI may be disposed at a lower level than the memory cell array MCA. This structure is referred to hereinafter as a cell over PERI (COP) structure. The peripheral circuit portion PERI may include one or more control circuits for driving the memory cell array MCA. At least one control circuit of the peripheral circuit portion PERI may include an N-channel transistor, a P-channel transistor, a CMOS circuit, or a combination thereof. At least one control circuit of the peripheral circuit portion PERI may include an address decoder circuit, a read circuit, a write circuit, and so forth. At least one control circuit of the peripheral circuit portion PERI may include a planar channel transistor, a recess channel transistor, a buried gate transistor, a Fin channel transistor (FinFET), and so forth.

For example, the peripheral circuit portion PERI may include sub word line drivers SWD1 and SWD2 and a sense amplifier SA. The upper-level double word line DWL may be connected to the first sub word line driver SWD1 through the first word line pads WLP1 and first metal interconnections MI1. The lower-level double word line DWL may be connected to the second sub word line driver SWD2 through the second word line pads WLP2 and second metal interconnections MI2. The bit lines BL may be connected to the sense amplifier SA through metal interconnections MI3. The metal interconnections MI3 may include a multi-level metal (MLM) structure including a plurality of vias and a plurality of metal interconnections.

Figure 6:
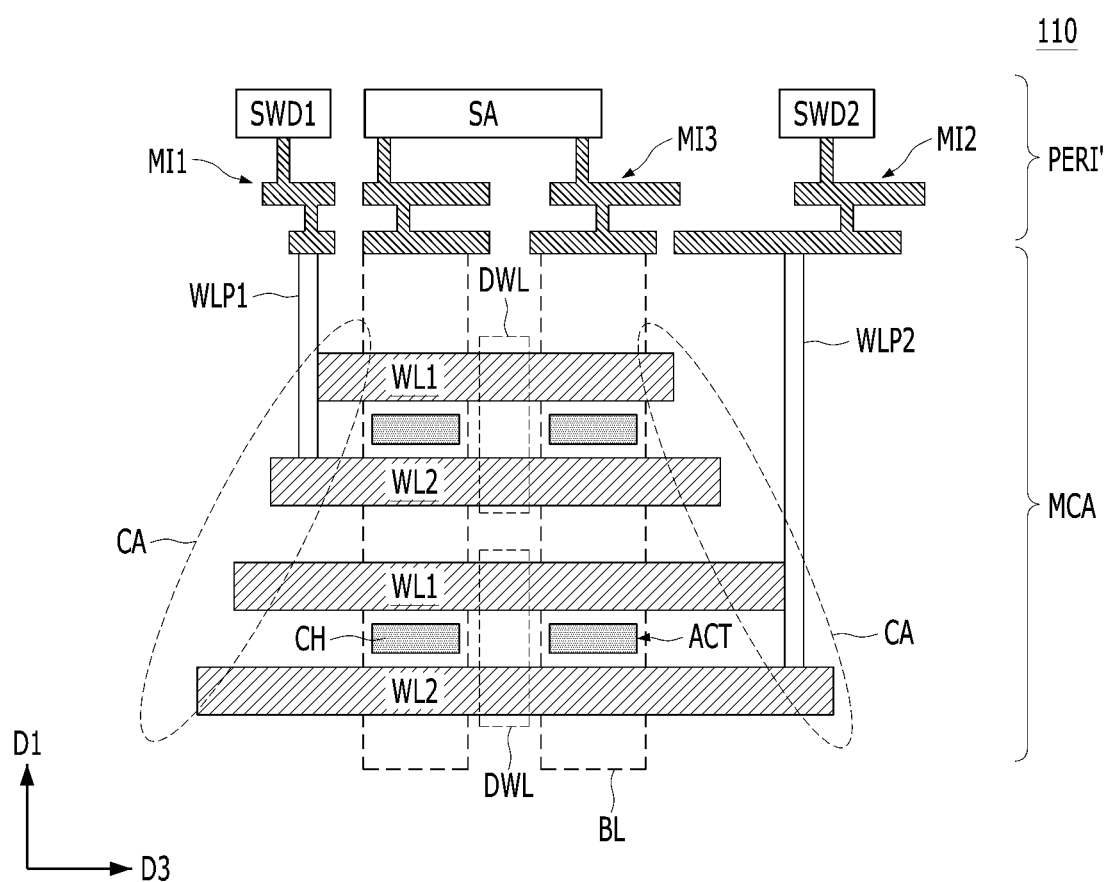
FIG. 6 is a modified example of FIG. 5 illustrating a semiconductor memory device according to another embodiment of the present invention.

FIG. 6 is a schematic cross-sectional view illustrating a memory cell array of a semiconductor memory device according to another embodiment of the present invention. FIG. 6 illustrates a semiconductor memory device 110 having a Peri over Cell (POC) structure. In FIG. 6, detailed descriptions of the same components with those in FIG. 5 may be omitted.

Referring to FIG. 6, the semiconductor memory device 110 may include a memory cell array MCA and a peripheral circuit portion PERI'. The peripheral circuit portion PERI' may be positioned at a higher level than the memory cell array MCA. This structure is referred to hereinafter as a PERI over cell (POC) structure.

The peripheral circuit portion PERI' may include sub word line drivers SWD1 and SWD2 and a sense amplifier SA. The double word line DWL at the upper level may be connected to a first sub word line driver SWD1 through first word line pads WLP1 and first metal interconnections MI1. The double word line DWL at the lower level may be connected to a second sub word line driver SWD2 through second word line pads WLP2 and second metal interconnections MI2. The bit lines BL may be connected to the sense amplifier SA through third metal interconnections MI3. The metal interconnections MI3 may include a multi-level metal structure including a plurality of vias and a plurality of metal interconnections.

Figure 7:
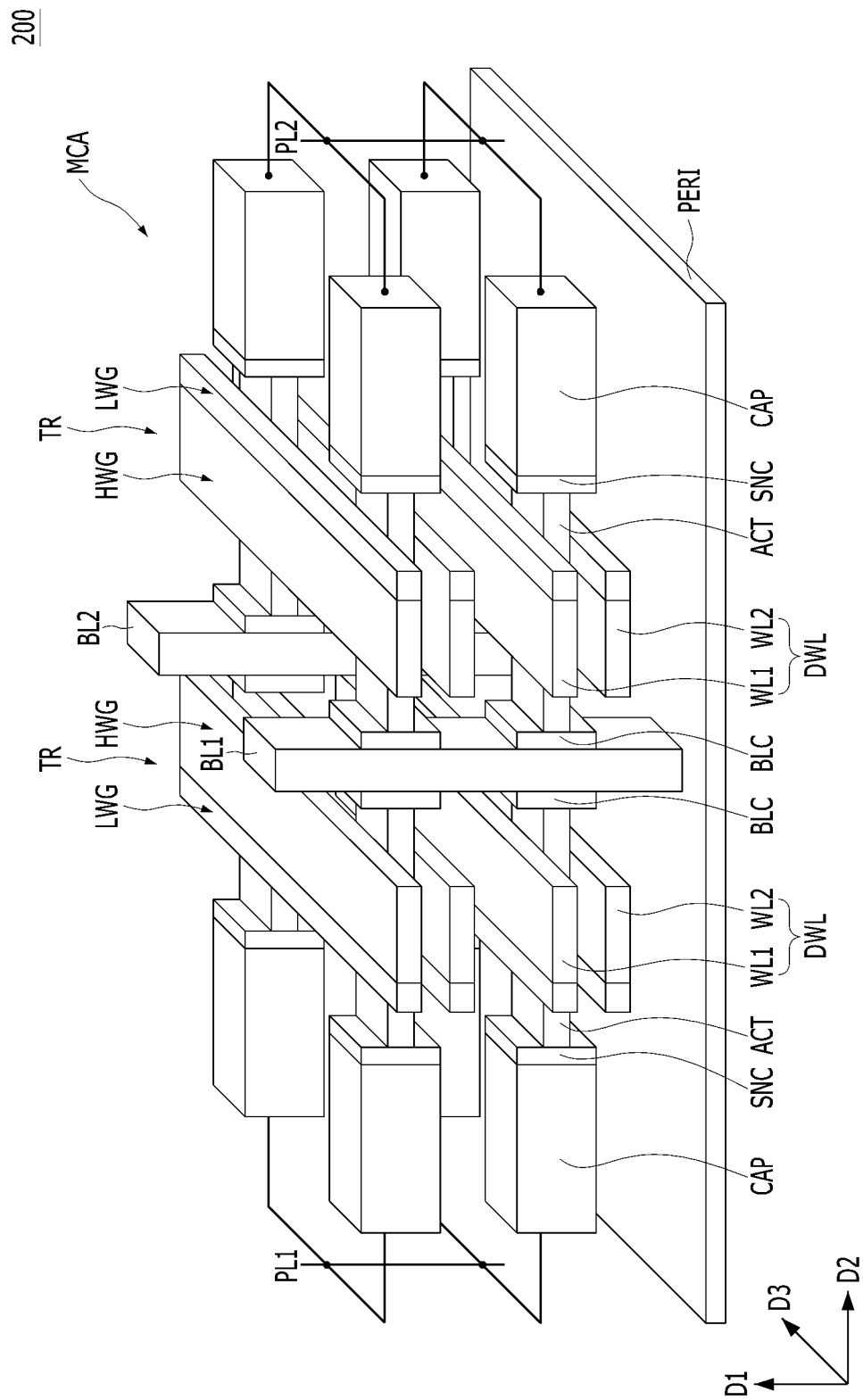
FIG. 7 is a schematic perspective view illustrating a semiconductor memory device according to another embodiment of the present invention.

FIG. 7 is a schematic perspective view illustrating a semiconductor memory device according to another embodiment of the present invention. In FIG. 7, detailed descriptions of the same components with those in FIGS. 1 to 6 may be omitted.

Referring to FIG. 7, a semiconductor memory device 200 may include a peripheral circuit portion PERI and a memory cell array MCA formed on the peripheral circuit portion PERI. The memory cell array MCA may include a plurality of memory cells. Similar to the memory cell array MCA referred in FIG. 3, in FIG. 7, the memory cell array MCA may include a column array of memory cells and a row array of memory cells. Each of the memory cells may include a transistor TR and a capacitor CAP. Each of the transistors TR may include an active layer and a double word line DWL. The double word line DWL may include a low work function electrode LWG and a high work function electrode HWG which are adjacent to each other along the second direction D2. Each of the capacitors may be connected to the active layer ACT through the storage contact node SNC. Each of the bit lines BL1 and BL2 may connect to the active layer through the bit line contact node BLC.

The column array of memory cells may include a mirror type structure sharing the bit lines BL1 and BL2.

A column array, for example, may include memory cells which are horizontally arranged in the second direction D2 with the bit line BL1 interposed therebetween. The column array may be arranged in the mirror type structure by being connected to different plate lines PL1 and PL2 and sharing the bit line BL1. A column array, for example, may include memory cells which are horizontally arranged in the second direction D2 with the bit line BL2 interposed therebetween. The column array may be arranged in the mirror type structure by being connected to different plate lines PL1 and PL2 and sharing the bit line BL2.

FIGS. 8A to 8I are diagrams illustrating a method for fabricating a double word line according to one embodiment of the present invention.

Figure 8A:
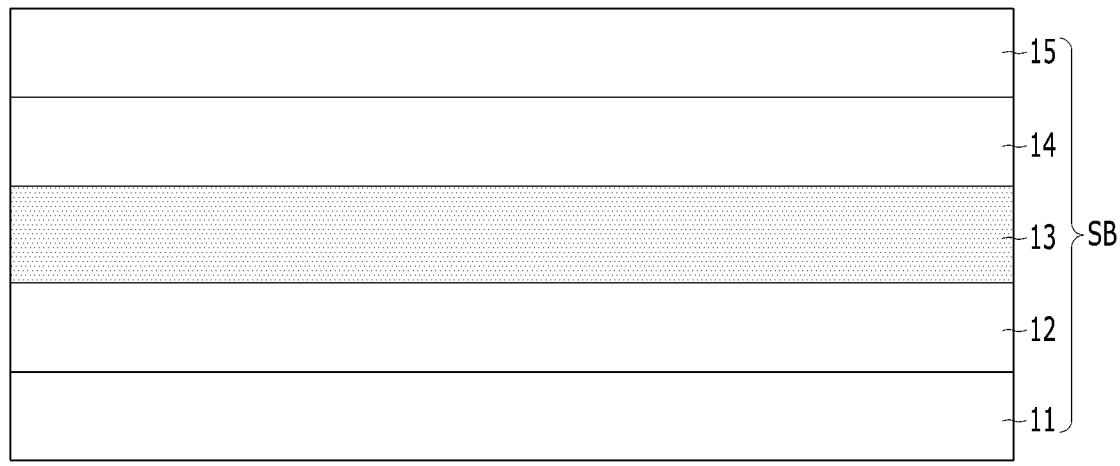
FIGS. 8A to 8I are diagrams illustrating a method for fabricating a double word line according to one embodiment of the present invention.

As shown in FIG. 8A, a stack body SB may be formed. The stack body SB may include inter-level dielectric layers 11 and 15, sacrificial layers 12 and 14, and an active layer 13. The active layer 13 may be disposed between the lower inter-level dielectric layer 11 and the upper inter-level dielectric layer 15. The lower sacrificial layer 12 may be disposed between the lower inter-level dielectric layer 11 and the active layer 13. The upper sacrificial layer 14 may be disposed between the upper inter-level dielectric layer 15 and the active layer 13. The inter-level dielectric layers 11 and 15 may include silicon oxide. The sacrificial layers 12 and 14 may include silicon nitride. The active layer 13 may include a semiconductor material or oxide semiconductor material. The active layer may include monocrystalline silicon, polysilicon, or IGZO.

Figure 8B:
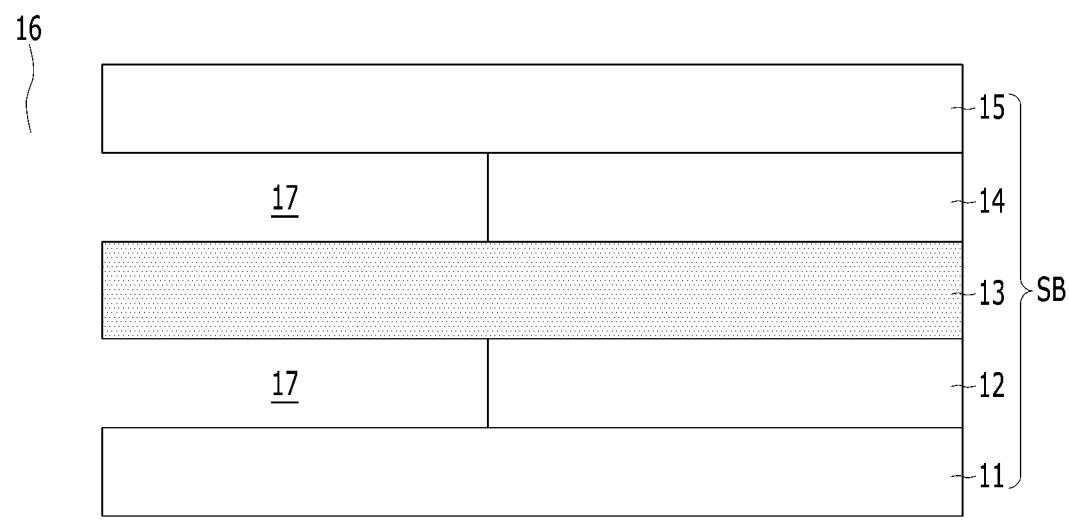

As shown in FIG. 8B, a first opening 16 may be formed by etching the stack body SB. The first opening 16 may extend vertically. A plurality of active layers 13 may be formed between the sacrificial layers 12 and 14. For example, the plurality of active layers 13 may be laterally arranged in the same surface similar to the active layer ACT shown in FIG. 3. For example, a process of forming a plurality of active layers 13 may include forming a stack body in which the sacrificial layers 12 and 14 are disposed on the insulating layers 11 and 15 and a flat shape semiconductor layer is disposed between the sacrificial layers 12 and 14, forming a plurality of device separation holes by etching the stack body SB, forming a plurality of semiconductor layer patterns laterally arranged between the sacrificial layers 12 and 14 by recess etching the flat shape semiconductor layer through the device separation hole.

Next, recesses 17 may be formed by selectively etching the sacrificial layers 12 and 14 through the first opening 16. Parts of the active layer 13 may be exposed by the recesses 17.

Figure 8C:
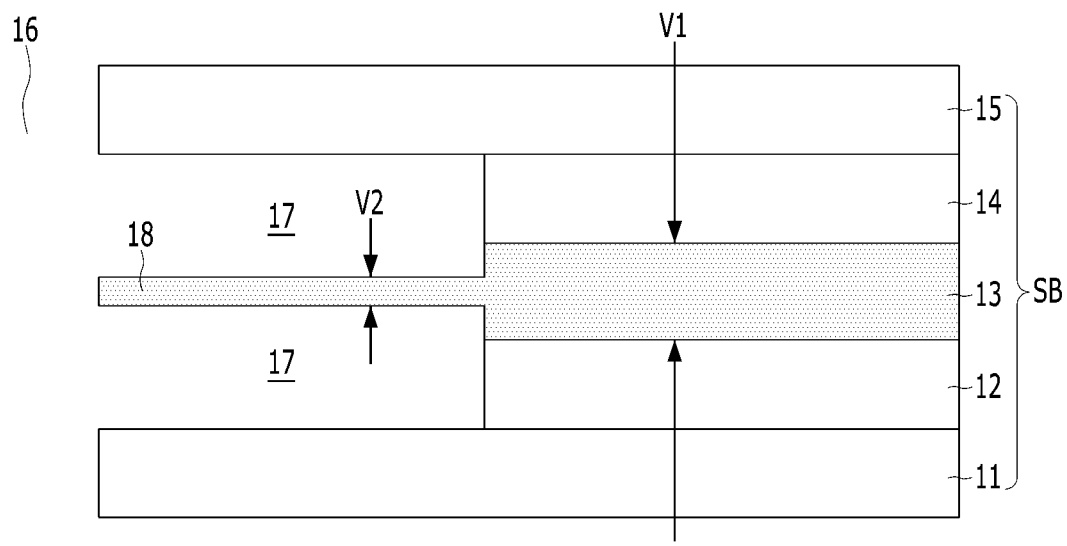

As shown in FIG. 8C, exposed parts of the active layer 13 may be recessed. Accordingly, the exposed parts may be thinned to form a thin-body 18. For example, the active layer 13 may have a first thickness V1, and the thin-body 18 may have a second thickness V2. The second thickness of the thin-body 18 may be smaller than the first thickness V1 of the active layer 13. The process of recessing the exposed parts of the active layer 13 is referred to hereinafter as a thinning process.

Figure 8D:
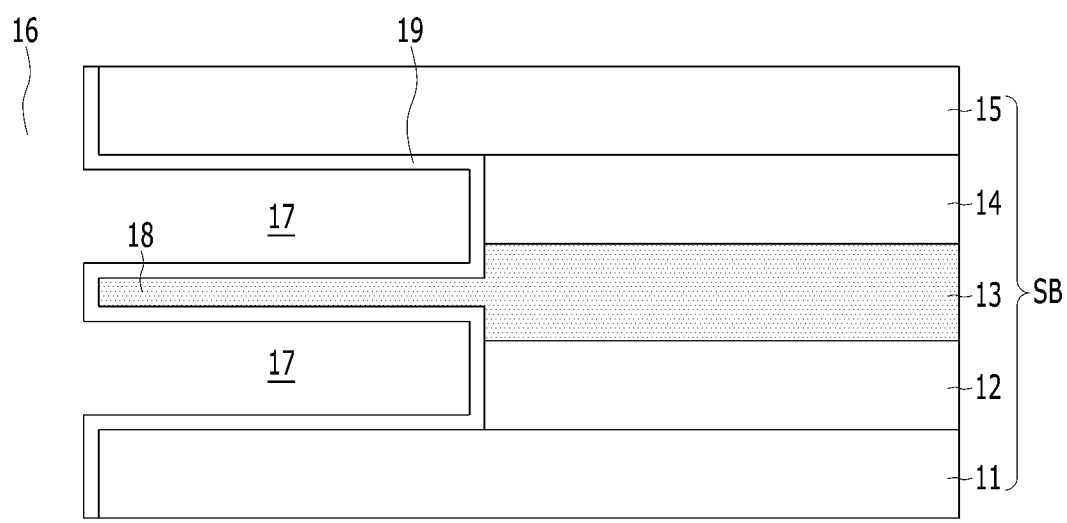

As shown in FIG. 8D, a gate dielectric layer 19 may be formed on the exposed parts of the thin-body 18. The gate dielectric layer 19 may include for example silicon oxide, silicon nitride, metal oxide, metal oxynitride, metal silicate, high-k material, ferroelectric material, anti-ferroelectric material, or a combination thereof. The gate dielectric layer 19 may include for example $SiO_2$, $Si_3N_4$, $HfO_2$, $Al_2O_3$, $ZrO_2$, AlON, HfON, HfSiO, HfSiON, or a combination thereof.

Figure 8E:
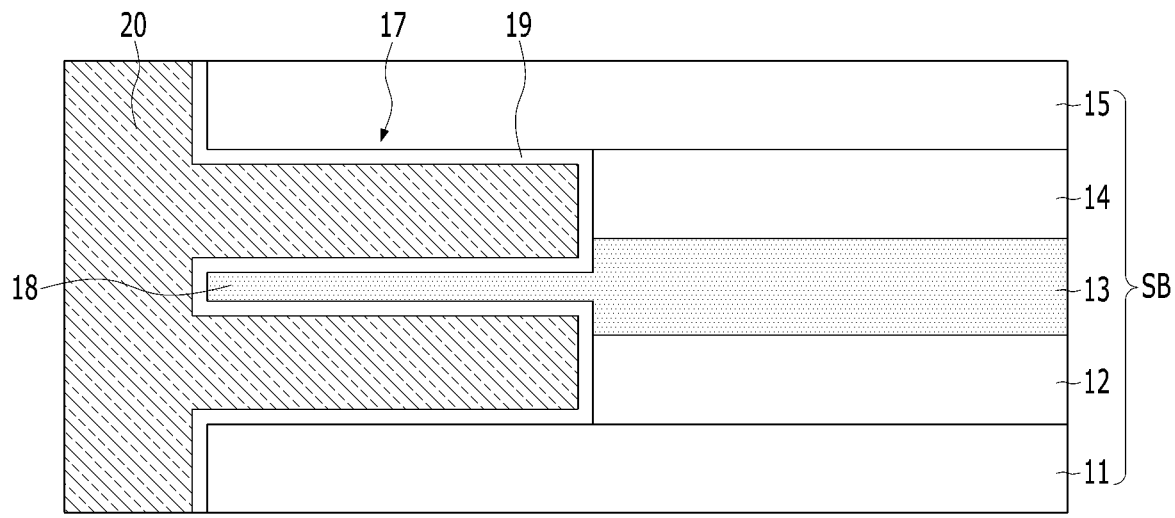

As shown in FIG. 8E, a low work function material 20 may be formed on the gate dielectric layer 19. The low work function material 20 may fill the first opening 16 and the recesses 17 over the gate dielectric layer 19. The low work function material 20 may include polysilicon doped with an N-type impurity.

Figure 8F:
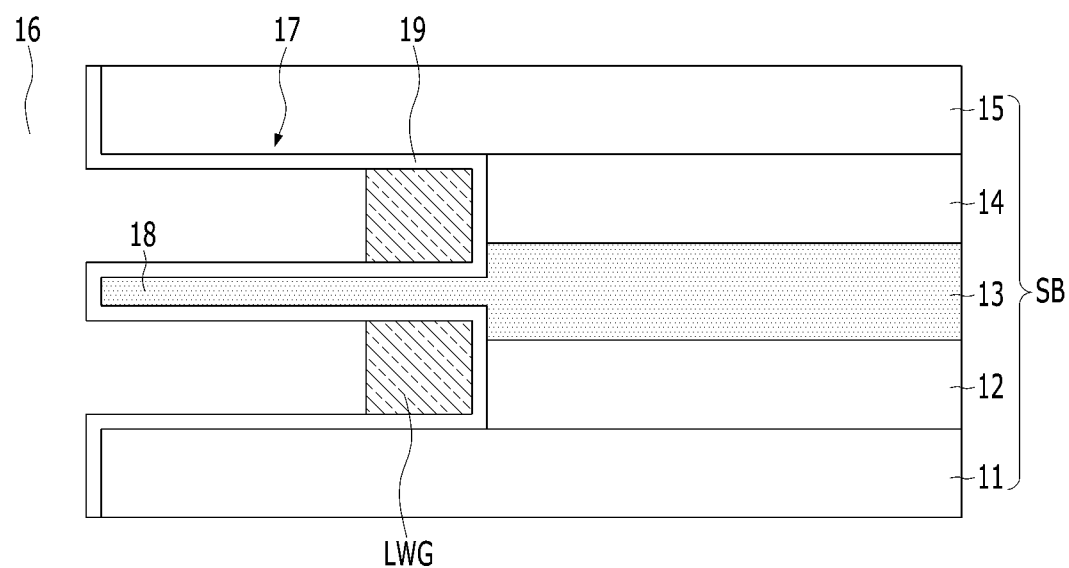

As shown in FIG. 8F, from the low function material 20 already present, a low work function electrode LWG may be formed in the recesses 17. For example, the low work function material 20 may be selectively etched to form the low work function electrode LWG. The selective etching of the low work function material 20 may include dry-etching or wet-etching. The selective etching of the low work function material 20 may be performed by a blanket etching without a mask.

Figure 8G:
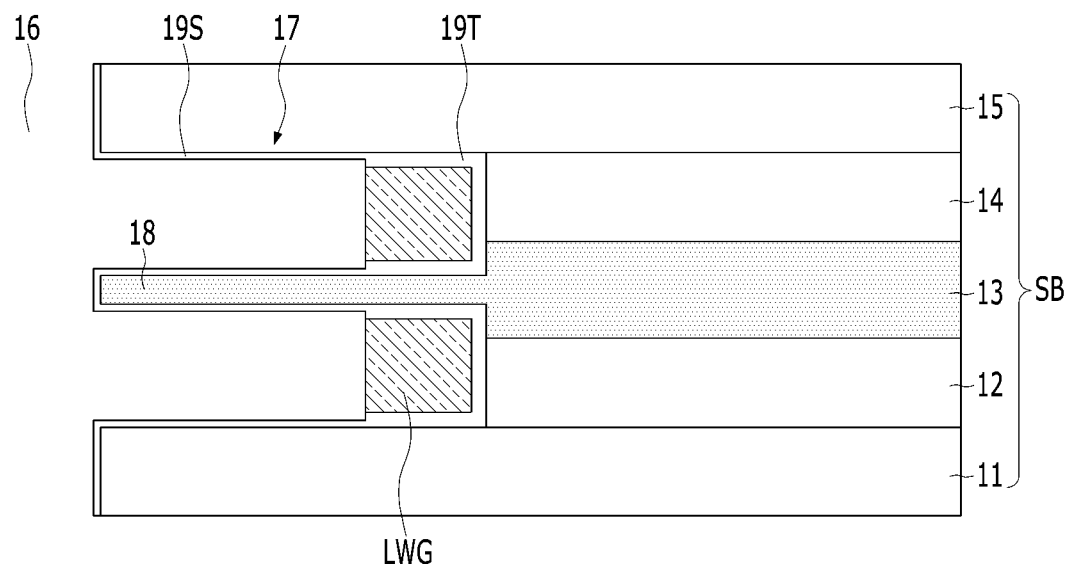

As shown in FIG. 8G, parts of the gate dielectric layer 19 exposed by the low work function electrode LWG may be selectively recessed. Accordingly, a second gate dielectric layer 19S may be formed as the exposed parts of the gate dielectric layer 19 are thinned. For example, the gate dielectric layer 19 may remain as a first gate dielectric layer 19T which is thicker than the second gate dielectric layer 19S. The first gate dielectric layer 19T may be formed between the thin-body 18 and the low work function electrode LWG.

Figure 8H:
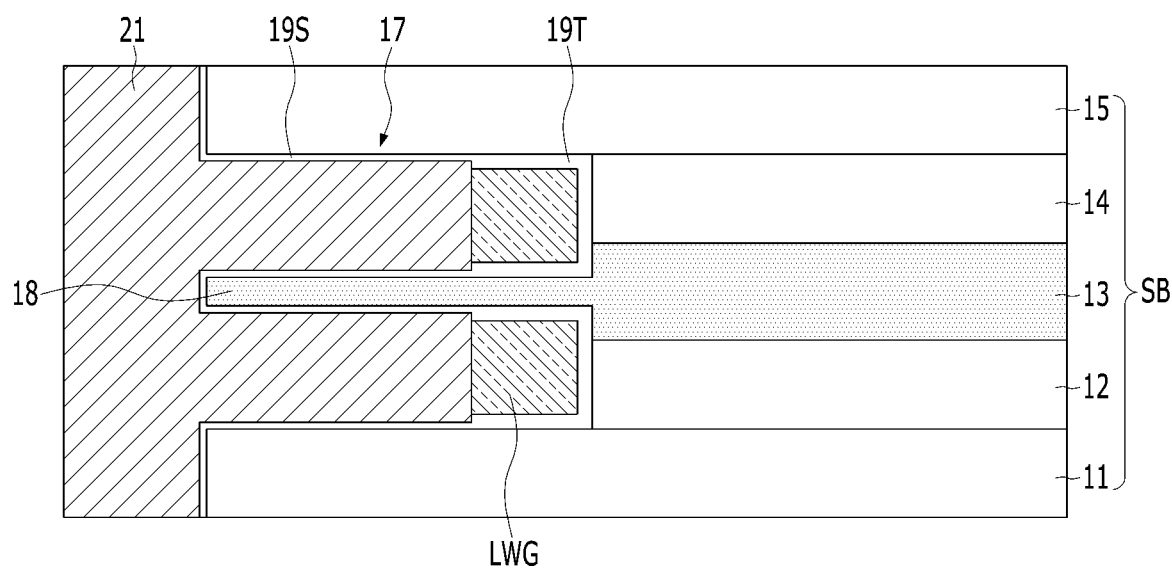

As shown in FIG. 8H, a high work function material 21 may fill the recesses 18 and the first opening 16 disposed between the second gate dielectric layer 19S and the low work function electrode LWG. The high work function material 21 may have a higher work function and a lower resistivity than the low work function electrode LWG. The high work function material 21 may include metal-base material. For example, the high work function material 21 may include for example titanium nitride, tungsten, or a combination thereof. In one embodiment of the present invention, the high work function material 21 may be a stack of titanium nitride and tungsten which sequentially stacked in this order.

Figure 8I:
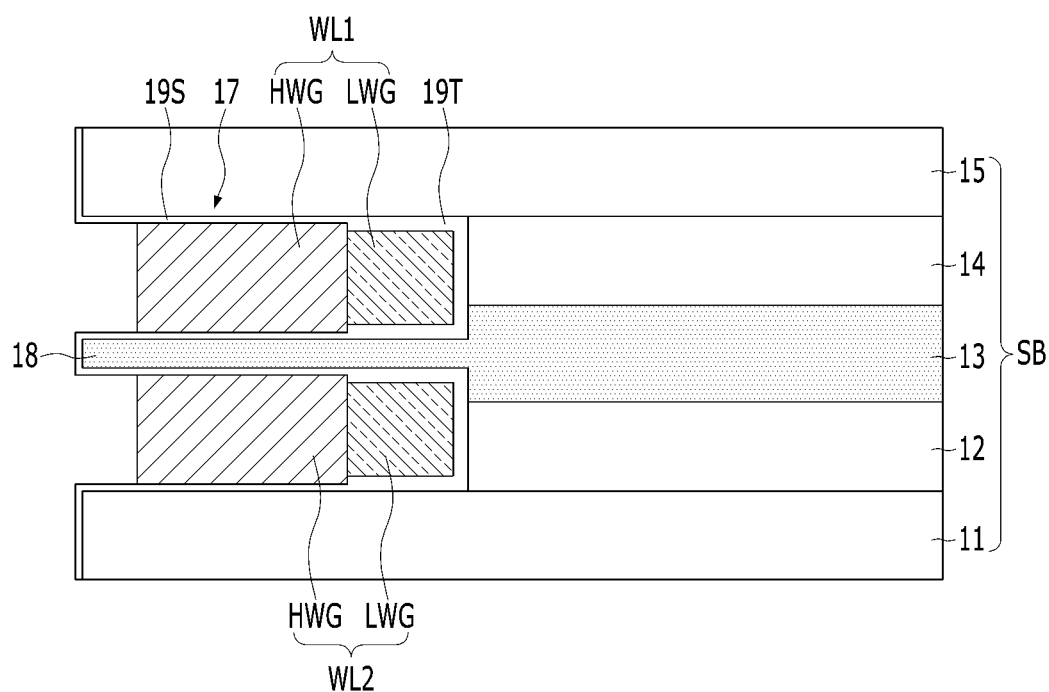

As shown in FIG. 8I, a high work function electrode HWG may be formed in the recesses. The high work function material 21 may be selectively etched to form the high work function electrode HWG.

The high work function electrode HWG may contact a side of the low work function electrode LWG. The high work function electrode HWG may have a higher work function than the low work function electrode LWG. The high work function electrode HWG may include a metal-base material. For example, the high work function electrode HWG may include for example titanium nitride, tungsten, or a combination thereof. The low work function electrode LWG may include polysilicon doped with an N-type impurity.

A thick first gate dielectric layer 19T may be formed between the thin-body 18 and the low work function electrode LWG. A thin second gate dielectric layer 19S may be formed between the thin-body 18 and the high work function electrode HWG.

A first word line WL1 and a second word line WL2 may be formed with the thin-body 18 interposed therebetween. The first and second word lines WL1 and WL2 may correspond to the double word line DWL referred in FIGS. 1 to 7. The first and second word lines WL1 and WL2 may have a dual work function electrode structure, each including a low work function electrode LWG and a high work function electrode HWG.

FIGS. 9A to 9I are diagrams illustrating a method for fabricating a bit line and a capacitor according to one embodiment of the present invention.

Figure 9A:
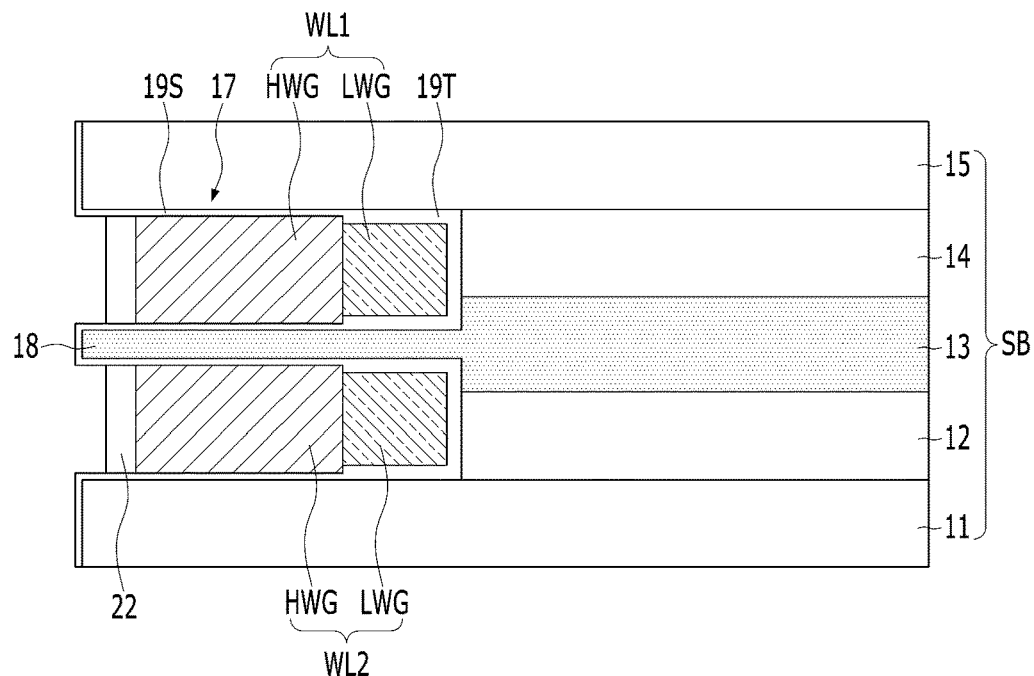
FIGS. 9A to 9I are diagrams illustrating a method for fabricating a bit line and capacitor according to one embodiment of the present invention.

As shown in FIG. 9A, liner layers 22 may be formed on the side of the high work function electrode HWG after forming the first and second word lines WL1 and WL2 through a series of the processes described in FIGS. 8A to 8I. The liner layers 22 may include silicon oxide or silicon nitride. The liner layers 22 may be recessed to fill the remaining space of the recesses 17.

Figure 9B:
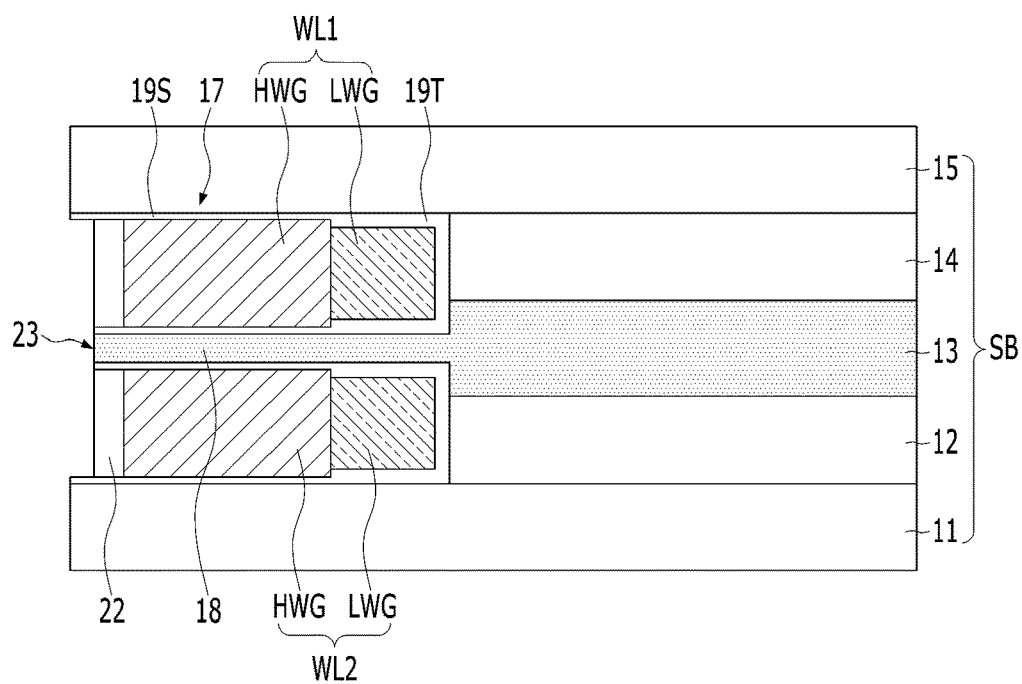

As shown in FIG. 9B, a first end portion 23 of the thin-body 18 may be exposed by etching a portion of the second gate dielectric layer 19S exposed by the liner layers 22.

Figure 9C:
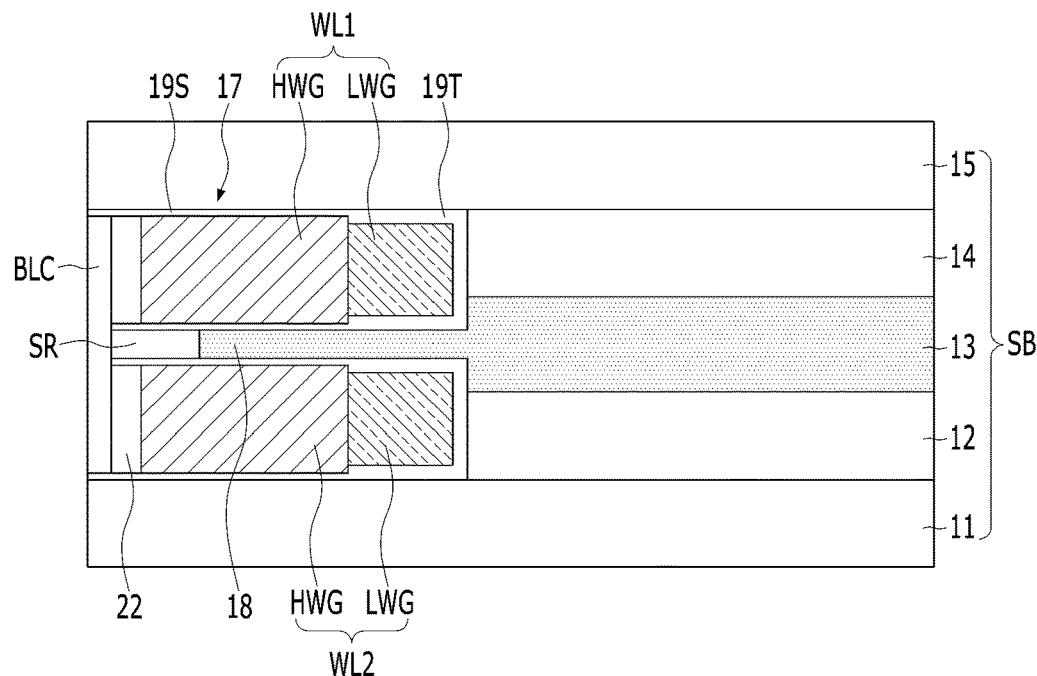

As shown in FIG. 9C, a bit line contact node BLC may be formed and connected to the first end portion 23 of the thin-body 18. The bit line contact node BLC may include polysilicon doped with an impurity. The bit line contact node BLC may be connected only to the first end portion 23 of the thin-body 18.

During or before forming the bit line contact node BLC, the first source/drain region SR may be formed on the first end portion of the thin-body 18. To form the first source/drain region SR, polysilicon including an impurity is formed on the liner layers 23 and the first end portion 23 of the thin-body 18, and then subsequent heat treatment may be performed to diffuse the impurity from the polysilicon to the first end portion 23 of the thin-body 18. Here, polysilicon doped with an impurity may become the bit line contact node BLC. In another embodiment, the first source/drain region SR may be formed by an impurity doping process and a heat treatment. Thereafter, the bit line contact node BLC may be formed.

Figure 9D:
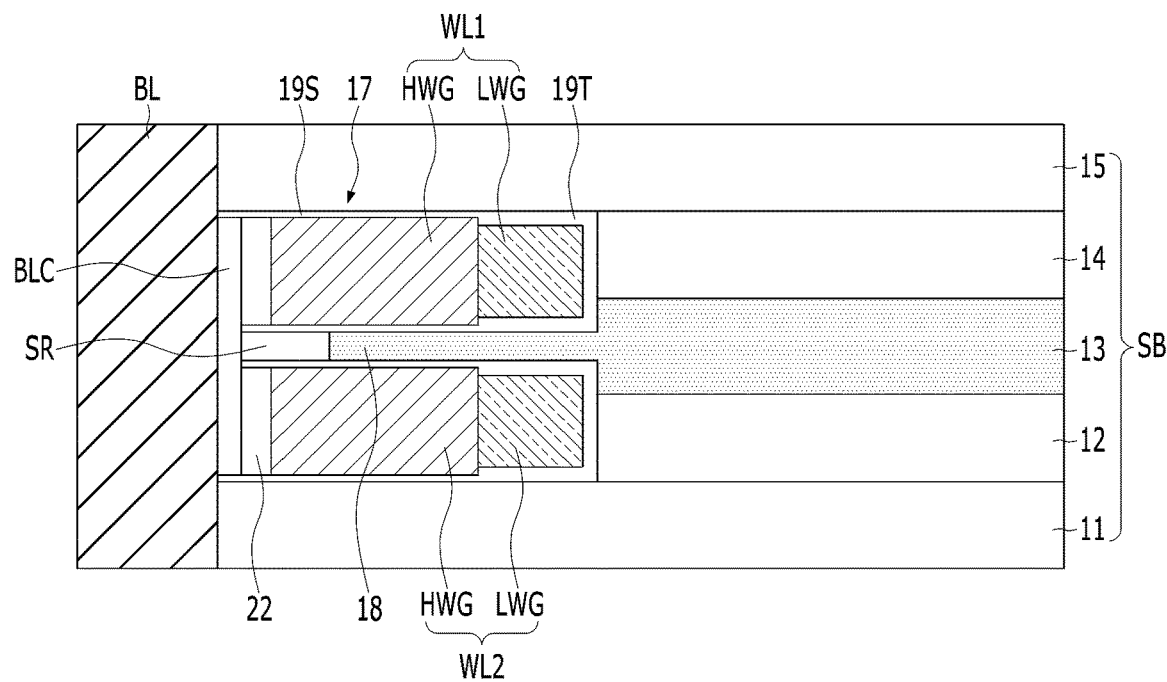

As shown in FIG. 9D, a bit line BL contacting the bit line contact node BLC may be formed on the first source/drain region SR. The bit line BL may fill the first opening 16. The bit line BL may include titanium nitride, tungsten, or a combination thereof. A bit line side-ohmic contact may further be formed between the bit line BL and the bit line contact node BLC. The bit line side-ohmic contact may include a metal silicide. For example, a metal silicide may be formed on the bit line contact node BLC by sequentially performing a metal layer deposition and an annealing, and unreacted metal layer may be removed. The metal silicide may be formed by a reaction between the silicon of the bit line contact node BLC and the metal layer.

Figure 9E:
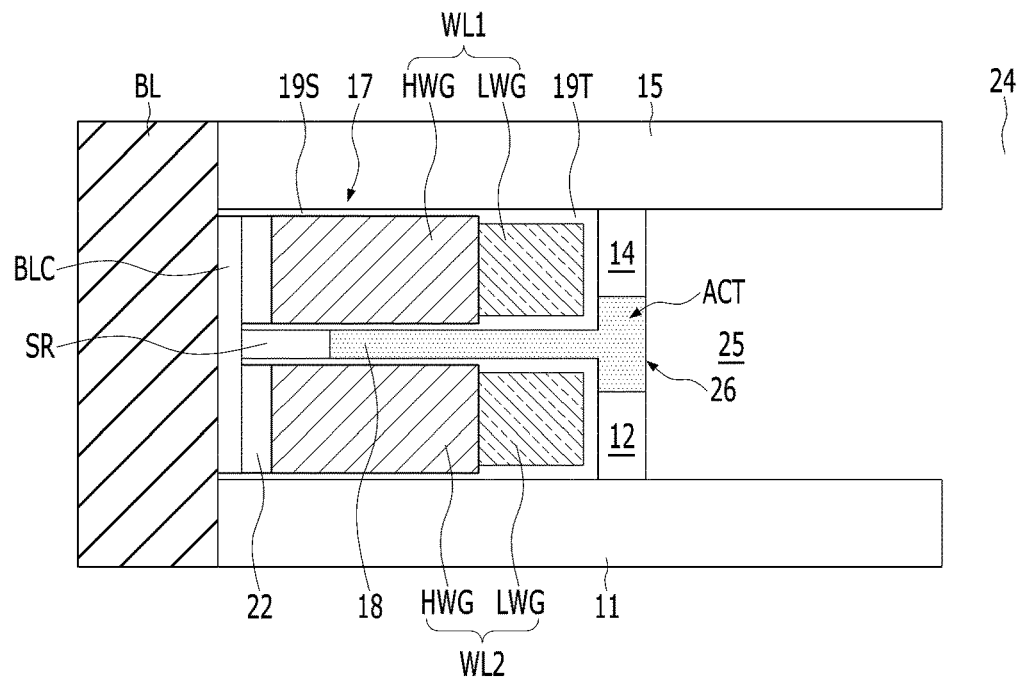

As shown in FIG. 9E, a second opening 24 may be formed by etching different part of the stack body SB. The second opening may extend vertically.

Next, the sacrificial layers 12 and 14 and the active layer 13 may be selectively recessed through the second opening 24. Accordingly, a capacitor opening 25 may be formed between the insulating layers 11 and 15. The active layer 13 may remain as the reference numeral "ACT" indicates in FIG. 9E. A side of the active layer ACT may include the thin-body 18. A second end portion 26 of the active layer ACT may be exposed by the capacitor opening 25. In another embodiment, the second end portion 26 of the active layer ACT may have the same thickness as the thin-body 18 as referred in FIG. 2.

Figure 9F:
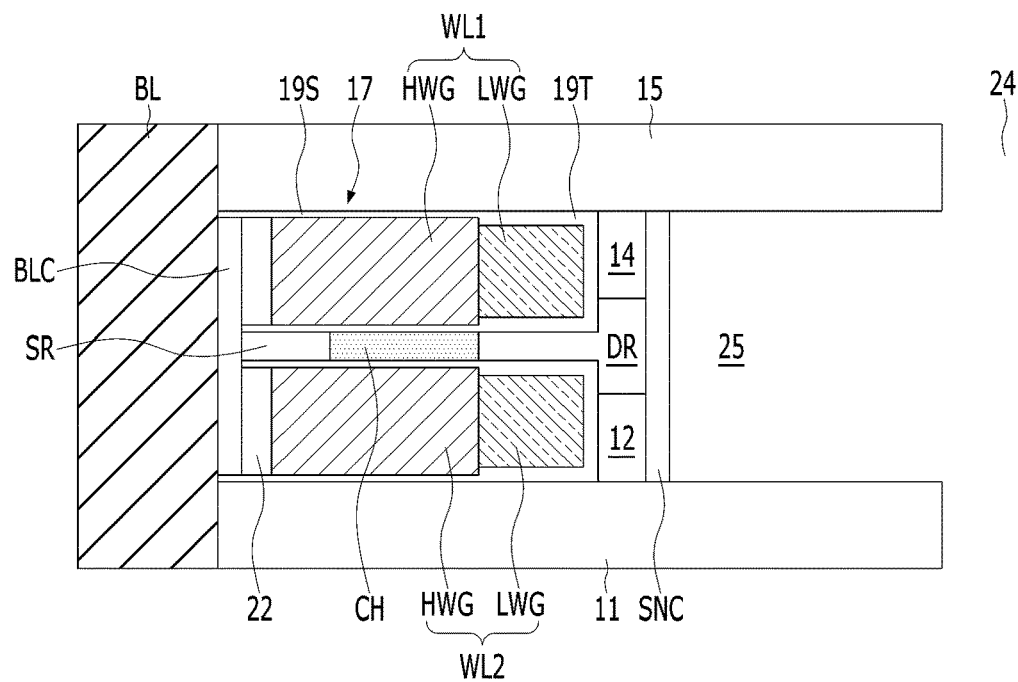

As shown in FIG. 9F, a storage contact node SNC contacting the second end portion 26 of the active layer ACT may be formed. The storage contact node SNC may include polysilicon doped with an impurity. The storage contact node SNC may be connected only to the second end portion 26 of the active layer ACT.

During or before forming the storage contact node SNC, the second source/drain region DR may be formed on the second end portion 26 of the active layer ACT. To form the second source/drain region DR, polysilicon including an impurity is formed on the second opening 24 and the capacitor opening 25, and then subsequent heat treatment may be performed to diffuse the impurity from the polysilicon to the second end portion 26 of the active layer ACT. Here, the polysilicon doped with an impurity may become the storage contact node SNC. In another embodiment, the second source/drain region DR may be formed by an impurity doping process and a heat treatment. Thereafter, the storage contact node SNC may be formed.

A thin-body channel CH may be defined between the first source/drain region SR and the second source/drain region DR.

Figure 9G:
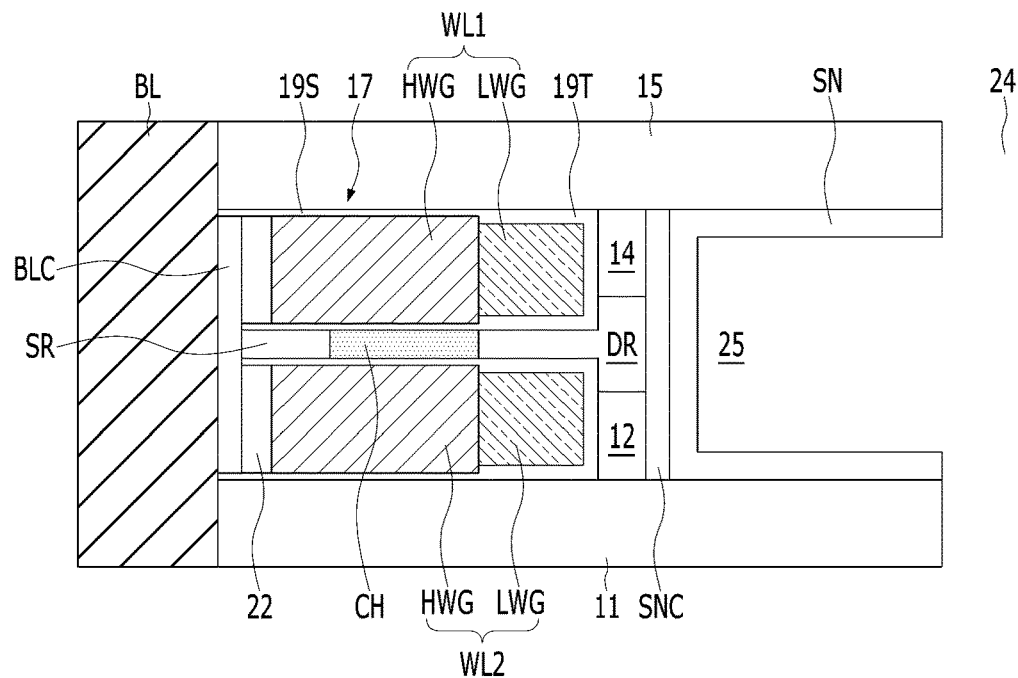

As shown in FIG. 9G, a storage node SN contacting the storage contact node SNC may be formed. To form the storage node SN, deposition of the conductive material and an etch-back process may be performed. The storage node SN may include titanium nitride. The storage node SN may have a laterally oriented cylinder shape.

Figure 9H:
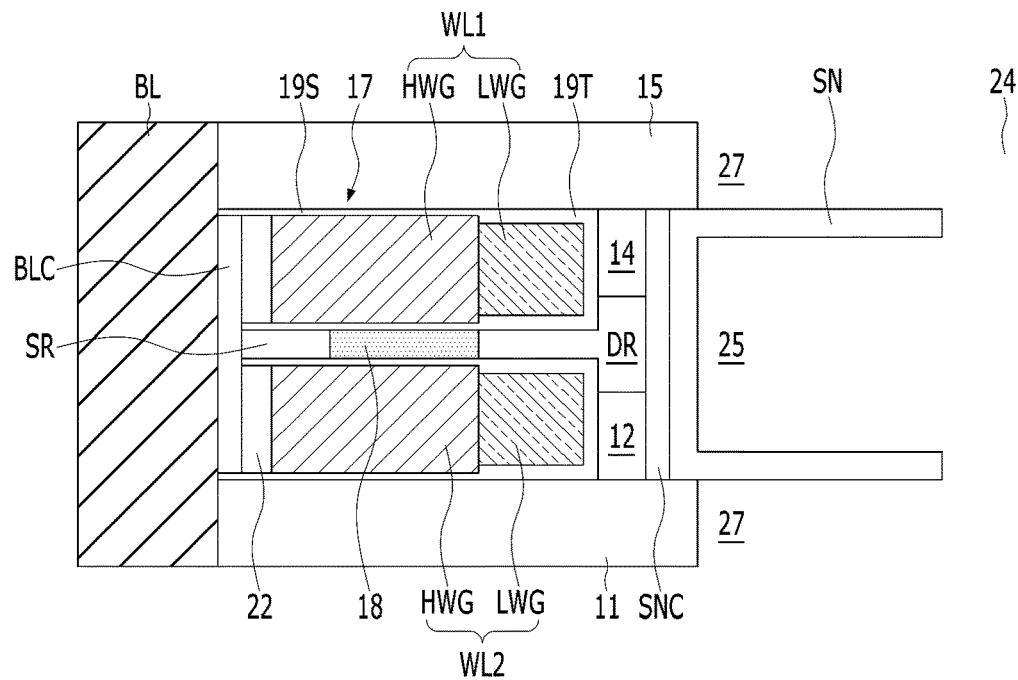

As shown in FIG. 9H, the inter-level dielectric layers 11 and 15 may be recessed (refer to reference numeral 27) to expose an outer wall of the storage node SN.

Figure 9I:
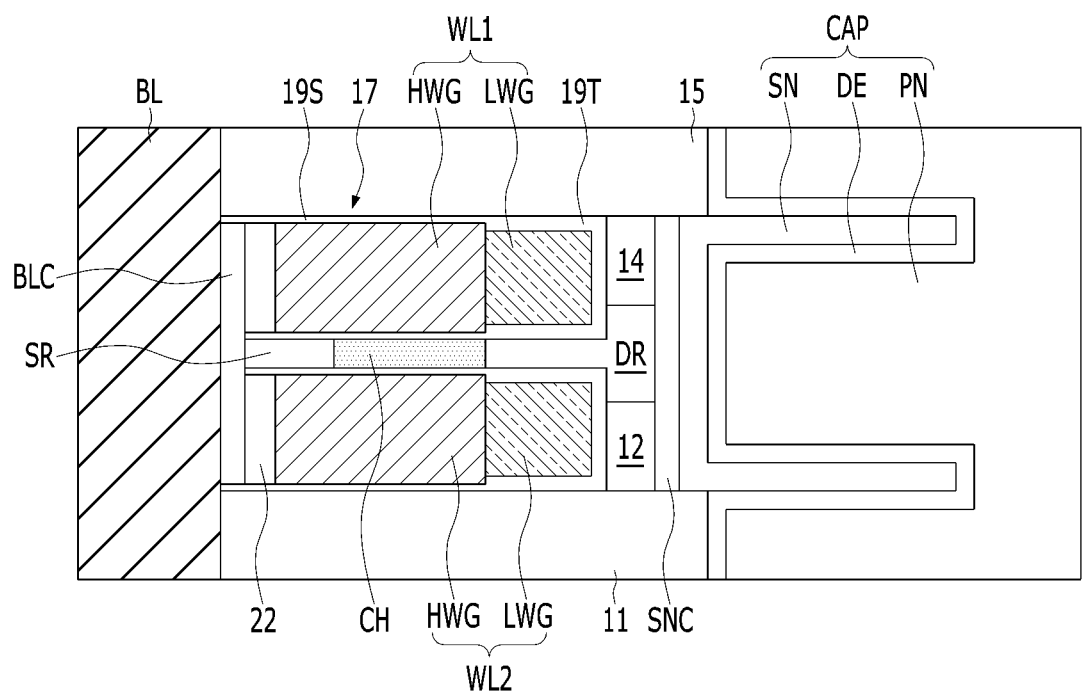

As shown in FIG. 9I, the dielectric layer DE and plate node PN may be sequentially formed on the storage node SN.

Figure 10A:
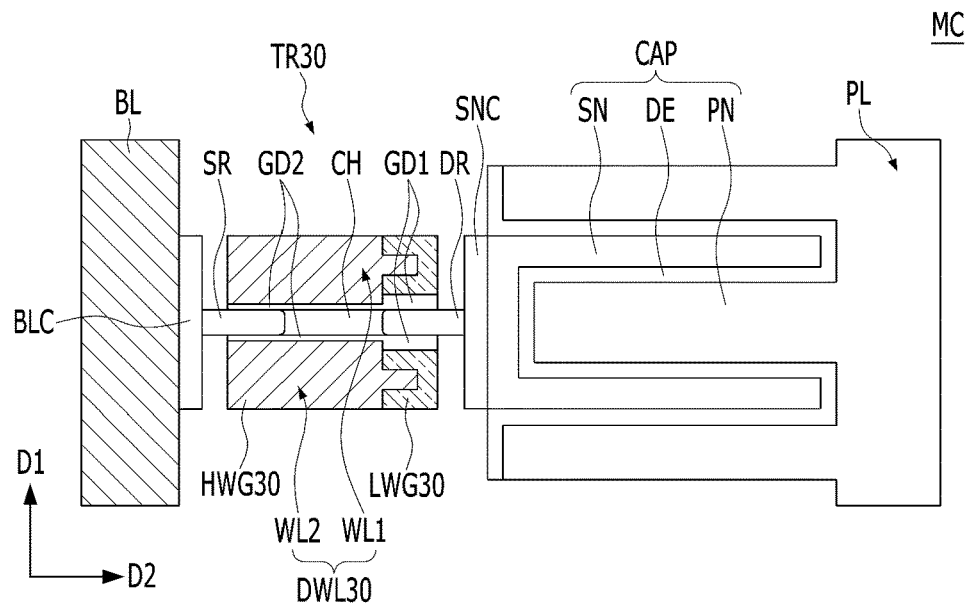
FIG. 10A is a cross-sectional view illustrating a memory cell according to another embodiment of the present invention.
Figure 10B:
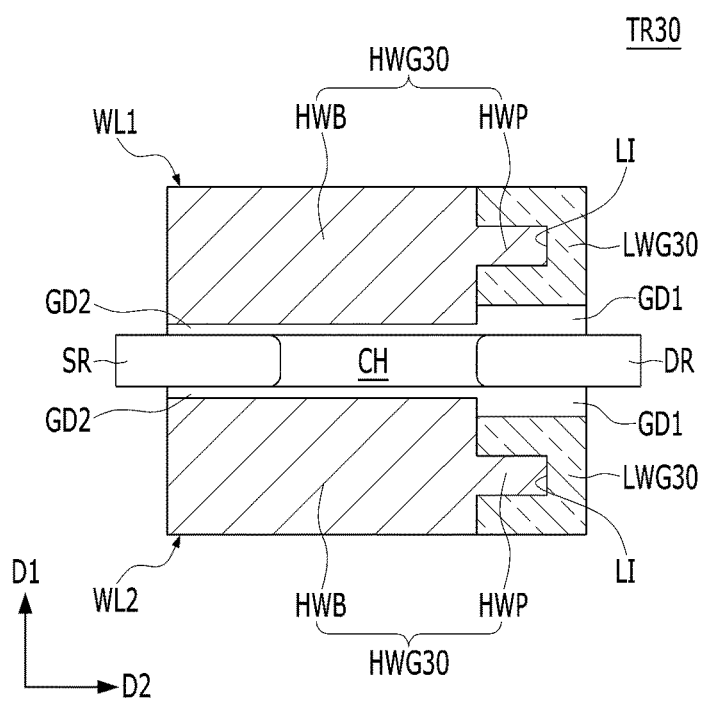
FIG. 10B is a detailed view of the transistor of FIG. 10A.

FIG. 10A is a cross-sectional view illustrating a memory cell according to another embodiment of the present invention. FIG. 10B is a detailed view of a transistor of FIG. 10A. FIGS. 10A and 10B illustrate a memory cell similar to the one shown in the FIG. 2. Hereinafter, detailed descriptions of the same components may be omitted.

Referring to FIGS. 10A and 10B, the memory cell MC may include a bit line BL, a transistor TR30, and a capacitor CAP. The transistor TR30 may include an active layer ACT, gate dielectric layers GD1 and GD2, and a double word line DWL30. The capacitor CAP may include a storage node SN, a dielectric layer DE, and a plate node PN. The bit line BL may have a pillar shape extending in a first direction D1. The active layer ACT may have a bar shape extending in a second direction D2 intersecting with the first direction D1. The double word line DWL30 may extend in a direction crossing the active layer ACT. The plate node PN of the capacitor CAP may be connected to the plate line PL. The active layer ACT may be laterally arranged from the bit line BL. The double word line DWL30 may include the first word line WL1 and the second word line WL2. The first word line WL1 and the second word line WL2 may face each other with the active layer ACT interposed therebetween. The gate dielectric layers GD1 and GD2 may be formed on upper and lower surfaces of the active layer ACT.

The first and second word lines WL1 and WL2 may each include a low work function electrode LWG30 and a high work function electrode HWG30. The low work function electrode LWG30 and the high work function electrode HWG30 may be laterally arranged along the second direction D2. The low work function electrode LWG30 may be adjacent to the second source/drain region DR, and the high work function electrode HWG30 may be adjacent to the first source/drain region SR. The low work function electrode LWG30 and the high work function electrode HWG30 are formed of different work function materials. The high work function electrode HWG30 has a higher work function than the low work function electrode LWG30. The high work function electrode HWG30 may include a high work function material. The high work function electrode HWG30 may have higher work function than the mid gap work function of silicon. The low work function electrode LWG30 may include a low work function material. The low work function electrode LWG may be a material having lower work function than the mid gap work function of silicon. In other words, the high work function material may have work function higher than 4.5 eV and the low work function material have work function lower than 4.5 eV. The low work function electrode LWG30 may include a doped polysilicon doped with an N-type dopant. The high work function electrode HWG30 may include a metal-base material. The high work function electrode HWG30 may include tungsten, titanium nitride, or a combination thereof. A barrier material may be formed between the low work function electrode LWG30 and the high work function electrode HWG30. The high work function electrode HWG30 may have a greater volume than the low work function electrode LWG, and thus the double word line DWL30 may have lower resistivity.

The high work function electrode HWG30 and the low work function electrode LWG30 each may vertically overlap with the active layer ACT along the first direction D1. The overlapping area between the high work function electrode HWG30 and the thin-body channel Ch may be greater than the overlapping area between the low work function electrode LWG30 and the second source/drain region DR. The low work function electrode LWG30 and the high work function electrode HWG30 may laterally extend. The low work function electrode LWG30 and the high work function electrode HWG30 may directly contact each other. The low work function electrode LWG30 may have an inner space LI. The inner space LI of the low work function electrode LWG30 may include a plurality of flat inner surfaces.

The high work function electrode HWG30 may include a body portion HWB adjacent to the thin-body channel CH and a protrusion portion HWP contacting the low work function electrode LWG30. The body portion HWB may vertically overlap with the thin-body channel CH. The protrusion portion HWP may extend from the body portion HWB in the second direction D2. The protrusion portion HWP may have a smaller height than the body portion HWB along the first direction D1. Surfaces of the protrusion portion HWB may be covered by the low work function electrode LWG30. That is, the protrusion portion HWP may fill the inner space LI of the low work function electrode LWG30 without a void. The protrusion portion HWP may be close to the capacitor CAP. The protrusion portion HWP may directly contact the first gate dielectric layer GD1. The body portion HWB may directly contact the second gate dielectric layer GD2. A distance between the body portion HWB and the thin-body channel Ch may be smaller than a distance between the protrusion portion HWP and the second source/drain region DR. A distance between one side of the body portion HWB and the capacitor CAP may be greater than a distance between one side of the protrusion portion HWP and the capacitor CAP. The body portion HWB and the protrusion portion HWP may be the same metal-base material and, for example, may include tungsten.

As described above, the first and second word lines WL1 and WL2 may each have a dual work function electrode structure which includes a low work function electrode LWG30 and a high work function electrode HWG30. In other words, the double word line DWL30 may have a pair of dual work function electrodes which extend in a direction crossing the thin-body channel CH with the thin-body channel CH interposed therebetween. The pair of the dual work function electrodes may refer to a pair of the first word line WL1 and the second word line WL2.

FIGS. 11A to 11E illustrate a method for fabricating a memory cell according to another embodiment of the present invention.

First, a gate dielectric layer 19 may be formed as referred in FIGS. 8A to 8E.

Figure 11A:
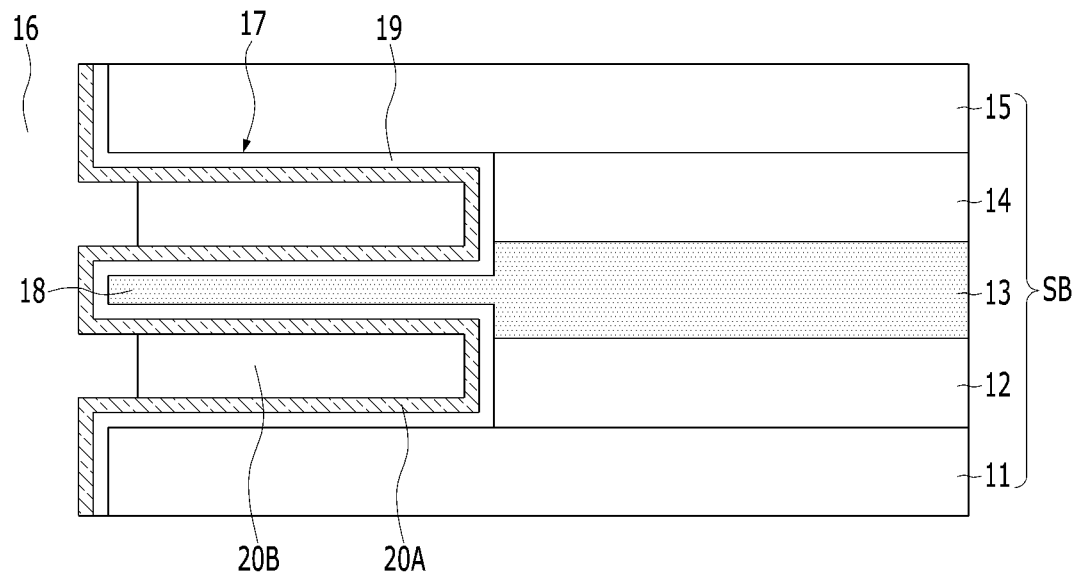
FIGS. 11A to 11E illustrate a method for fabricating a memory cell according to another embodiment of the present invention.

Next, a low work function liner layer 20A may be formed on the gate dielectric layer 19 as shown in FIG. 11A. The low work function liner layer 20A may be conformally formed on the gate dielectric layer 19 over the first opening 16 and the recesses 17. The low work function liner layer 20A may include polysilicon doped with an N-type impurity.

A sacrificial material 20B may be formed on the low work function liner layer 20A. The sacrificial material 20B may fill the recesses 17 over the liner layer 20A. The sacrificial material 20B may include silicon nitride. The sacrificial material 20B may be selectively recessed to remain only inside the recesses 17.

Figure 11B:
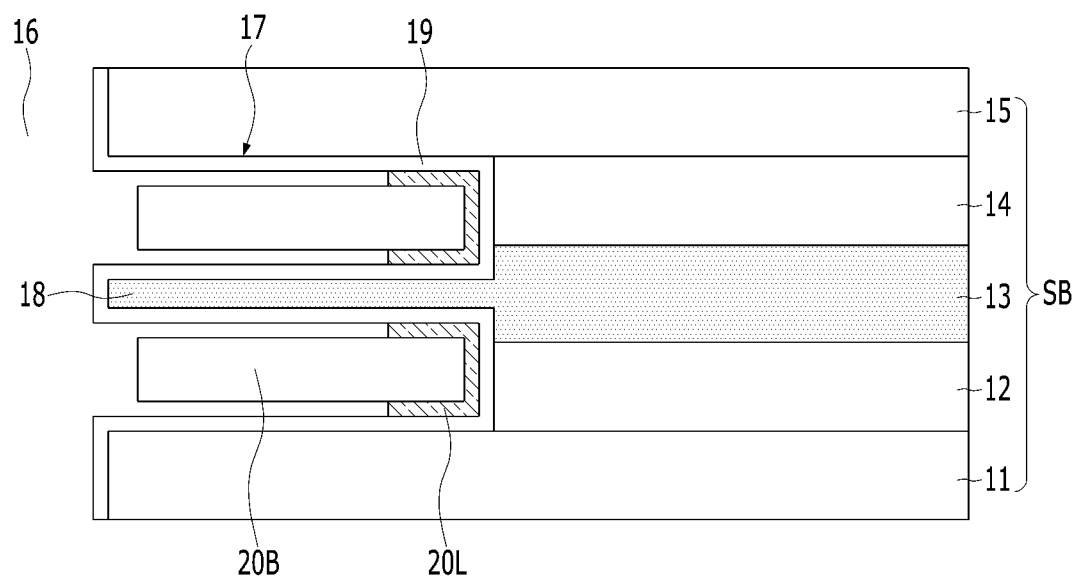

As shown in FIG. 11B, a low work function electrode 20L may be formed in the recesses 17. To form the low work function electrode 20L, the low work function liner layer 20A may be selectively etched. The low work function electrode 20L may include an inner space. The low work function electrode 20L may have a 'D' shape.

Figure 11C:
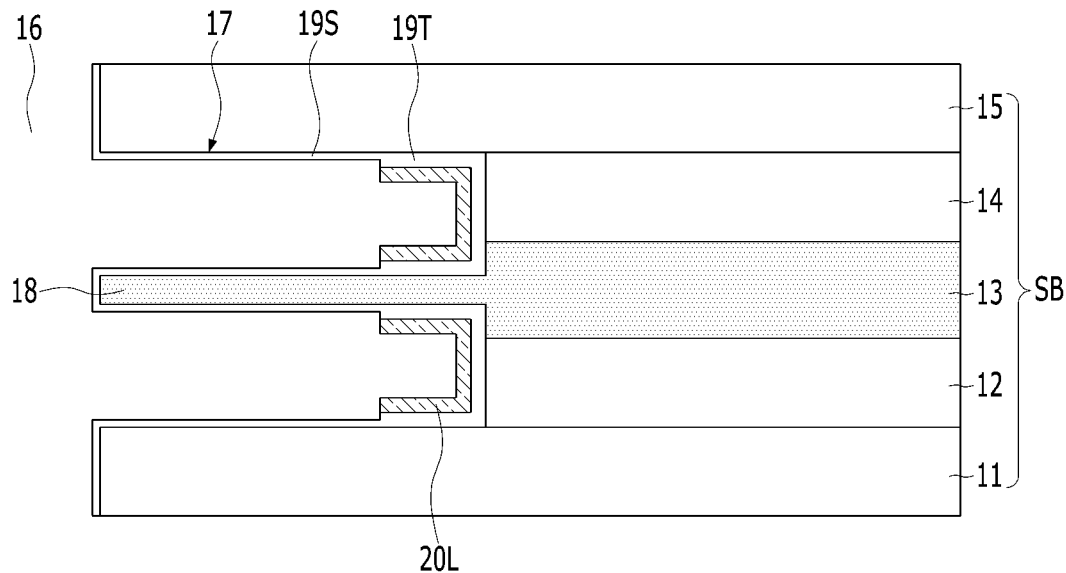

As shown in FIG. 11C, the sacrificial material 20B may be removed.

Next, parts of the gate dielectric layer 19 which are exposed by the low work function electrode 20L may be selectively recessed. Accordingly, exposed parts of the gate dielectric layer 19 may be thinned to form a second gate dielectric layer 19S. For example, the gate dielectric layer 19 may remain as the first gate dielectric layer 19T which is thicker than the second gate dielectric layer 19. The first gate dielectric layer 19T may be formed between the thin-body 18 and the low work function electrode 20L.

Figure 11D:
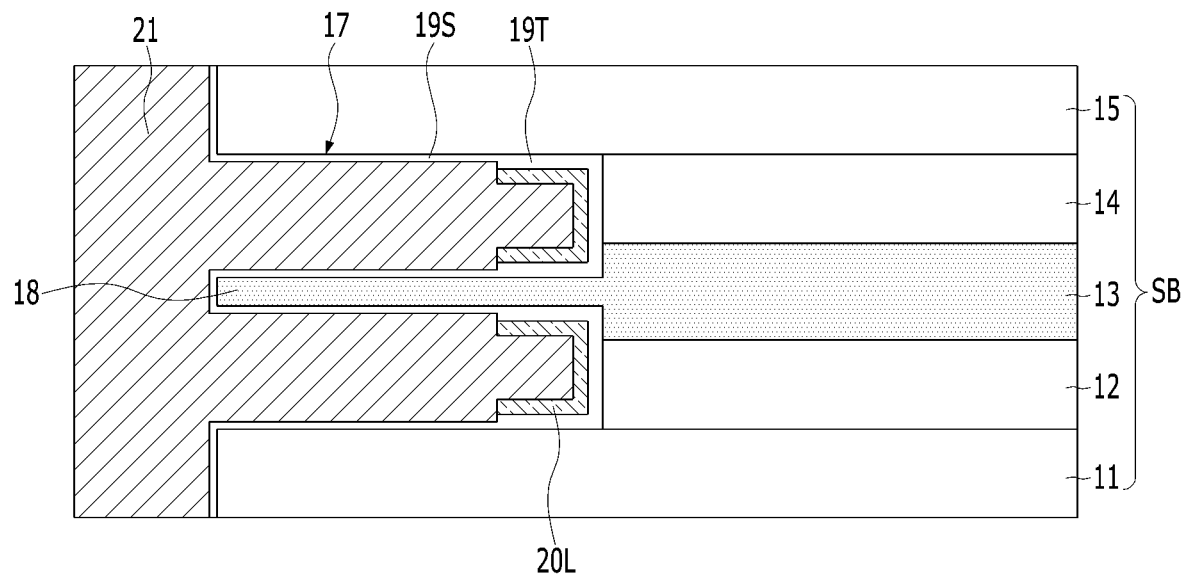

As shown in FIG. 11D, a high work function material 21 filling the recesses 17 and the first opening 16 may be formed between the second gate dielectric layer 19S and the low work function electrode 20L. The high work function material 21 may have a higher work function than the low work function electrode 20L, and may have a lower resistivity than the low work function electrode 20L. The high work function material 21 may include a metal-base material. For example, the high work function material 21 may include titanium nitride, tungsten, or a combination thereof. In this embodiment, the high work function material 21 may sequentially stack titanium nitride and tungsten.

Figure 11E:
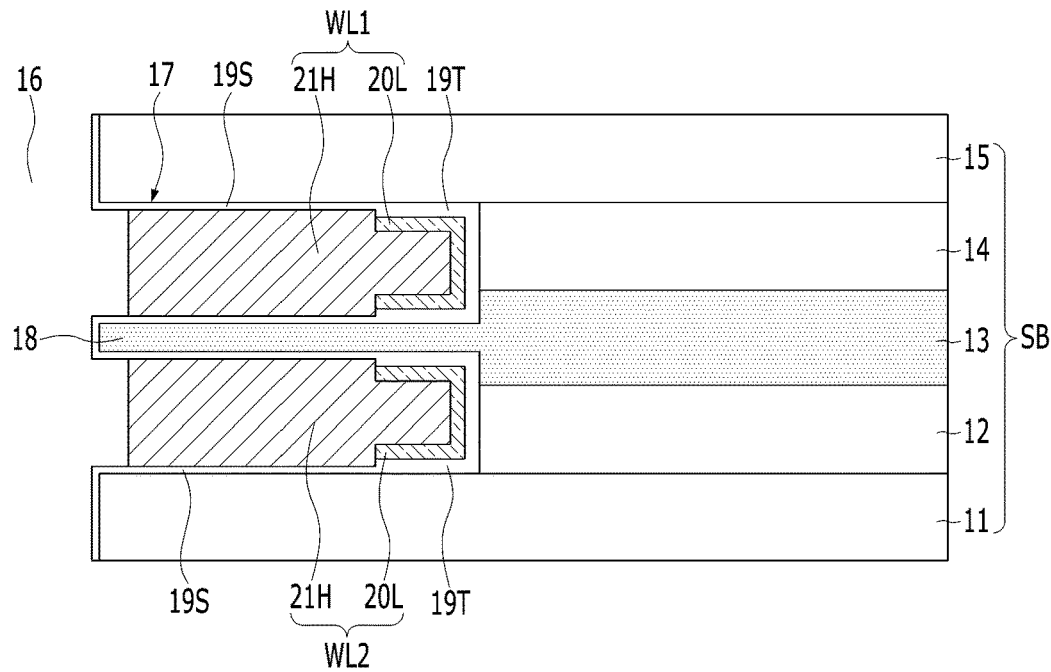

As shown in FIG. 11E, a high work function electrode 21H may be formed in the recesses 17. In order to form the high work function electrode 21H, selective etching of the high work function material 21 may be performed.

The high work function electrode 21H may contact a side of the low work function electrode 20L. The high work function electrode 21H may have a higher work function than the low work function electrode 21L. The high work function electrode 21H may include a metal-base material. For example, the high work function electrode 21H may include titanium nitride, tungsten, or a combination thereof, and the low work function electrode 20L may include polysilicon doped with an N-type impurity. The high work function electrode 21H may include a protrusion, and the protrusion may fill an inner space of the low work function electrode 21L.

As shown in FIG. 11E, a thick first gate dielectric layer 19T may be formed between the thin-body 18 and the low work function electrode 20L, and a thin second gate dielectric layer 19S may be formed between the thin-body 18 and the high work function electrode 21H.

As shown in FIG. 11E, the first word line WL1 and the second word line WL2 may be formed with the thin-body 18 interposed therebetween. The first and second word lines WL1 and WL2 may correspond to the double word line DWL referred in FIGS. 1 to 7. The first and second word lines WL1 and WL2 each may have a dual work function structure including the low work function electrode 20L and the high work function electrode 21H.

Figure 12:
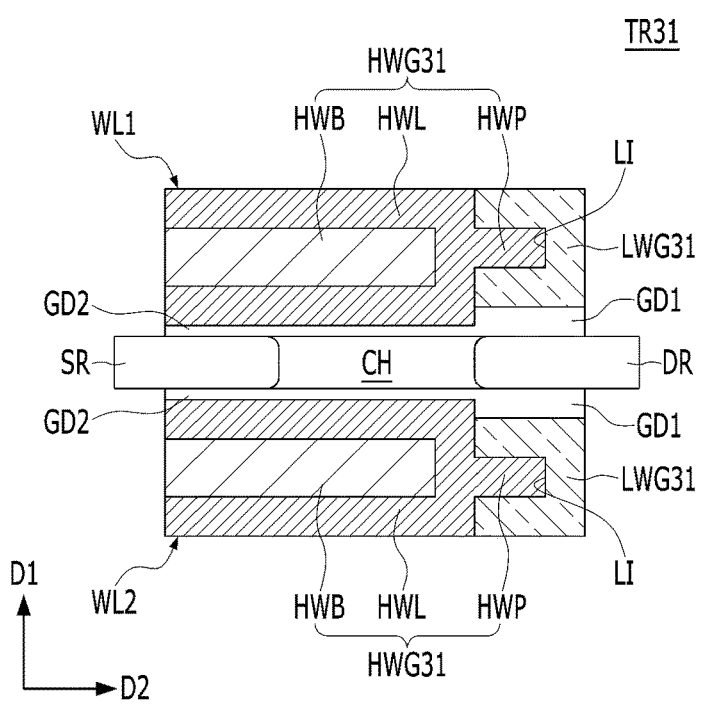
FIGS. 12 and 13 are detailed views of a transistor of a memory cell according to another embodiment of the present invention.
Figure 13:
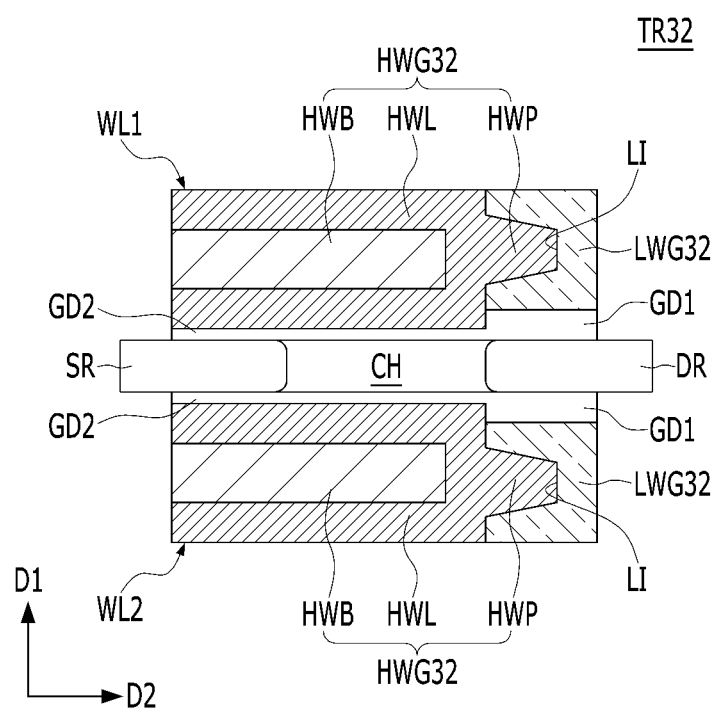

FIGS. 12 and 13 are detailed views illustrating a transistor of a memory cell according to another embodiment of the present invention. The memory cell illustrated in FIGS. 12 and 13 may be similar to the memory cells shown in FIGS. 2, 10A, and 10B. The transistors shown in FIGS. 12 and 13 are modified examples of the transistor of FIG. 10B. Hereinafter, detailed descriptions of duplicate components may be omitted.

Referring to FIG. 12, a transistor TR31 may include a first source/drain region SR, a second source/drain region DR, a thin-body channel CH, a first gate dielectric layer GD1, and a second gate dielectric layer GD2, a first word line WL1, and a second word line WL2.

The first and second word lines WL1 and WL2 may each include a low work function electrode LWG31 and a high work function electrode HWG31. The low work function electrode LWG31 and the high work function electrode HWG31 may be laterally positioned along the second direction D2. The low work function electrode LWG31 may be adjacent to the second source/drain region DR, and the high work function electrode HWG31 may be adjacent to the first source/drain region SR. The low work function electrode LWG31 and the high work function electrode HWG31 are formed of different work function materials. The high work function electrode HWG31 may have a higher work function than the low work function electrode LWG31. The high work function electrode HWG31 may include a high work function material. The high work function electrode HWG31 may have a work function higher than the mid-gap work function of silicon. The low work function electrode LWG31 may include a low work function material. The low work function electrode LWG31 may be composed of a material having a work function lower than the mid-gap work function of silicon. In other words, the high work function material may have a work function higher than 4.5 eV, and the low work function material may have a work function lower than 4.5 eV. The low work function electrode LWG31 may include doped polysilicon which is doped with an N-type dopant. The high work function electrode HWG31 may include a metal-base material. The high work function electrode HWG31 may include tungsten, titanium nitride, or a combination thereof. A barrier material may be formed between the low work function electrode LWG31 and the high work function electrode HWG31. The high work function electrode HWG31 may have a greater volume than the low work function electrode LWG31. Accordingly, the first and second word lines WL1 and WL2 may have low resistivity.

The high work function electrode HWG31 and the thin-body channel CH may vertically overlap in the first direction D1. The high work function electrode HWG31 and the first source/drain region SR may vertically overlap in the first direction D1. The low work function electrode LWG31 and the second source/drain region DR may vertically overlap in the first direction D1. The low work function electrode LWG31 and the high work function electrode HWG31 may extend parallel to each other, and the low work function electrode LWG31 and the high work function electrode HWG31 may directly contact each other.

The high work function electrode HWG31 may include a bulk electrode HWB and a barrier electrode HWL covering a portion of the bulk electrode HWB. The barrier electrode HWL may include a protrusion portion HWP contacting the low work function electrode LWG31. The barrier electrode HWL and the protrusion portion HWP may be integrated in a single body. The barrier electrode HWL and the protrusion portion HWP may be thinner than the bulk electrode HWB. The protrusion portion HWP may be covered by the inner space LI of the low work function electrode LWG31. The inner space LI of the low work function electrode LWG31 may include a plurality of flat inner surfaces. Here, the flat inner surfaces may include one vertical flat inner surface extending along the first direction D1 and a pair of lateral flat inner surfaces extending along the second direction D2. The protrusion portion HWP may fill the inner space LI of the low work function electrode LWG31 without a void.

The bulk electrode HWB may include a metal material, and the barrier electrode HWL may include a metal nitride. For example, the bulk electrode HWB may be tungsten, and the barrier electrode HWL and the protrusion portion HWP may be titanium nitride. The low work function electrode LWG31 may be N-type polysilicon.

A method of forming the barrier electrode HWL including the protrusion portion HWP may be similar to the method of FIG. 11D. For example, in FIG. 11D, titanium nitride and tungsten may be stacked as the high work function material 21. In this case, the titanium nitride may correspond to the barrier electrode HWL, and the titanium nitride may be formed while filling the inner space of the low work function electrode 20L. Tungsten may correspond to the bulk electrode HWB.

Referring to FIG. 13, the transistor TR32 may include a first source/drain region SR, a second source/drain region DR, a thin-body channel CH, a first gate dielectric layer GD1, a second gate dielectric layers GD2, a first word line WL1, and a second word line WL2.

The first and second word lines WL1 and WL2 may each have a low work function electrode LWG32 and a high work function electrode HWG32. The low work function electrode LWG32 and the high work function electrode HWG32 may be laterally positioned along the second direction D2. The low work function electrode LWG32 may be adjacent to the second source/drain region DR, and the high work function electrode HWG32 may be adjacent to the first source/drain region SR. The low work function electrode LWG32 and the high work function electrode HWG32 are formed of different work function materials. The high work function electrode HWG32 may have higher work function than the low work function electrode LWG32.

The high work function electrode HWG32 may include a bulk electrode HWB and a barrier electrode HWL covering a portion of the bulk electrode HWB. The barrier electrode HWL may include a protrusion portion HWP contacting the low work function electrode LWG32. The barrier electrode HWL and the protrusion portion HWP may be integrated in a single body. The barrier electrode HWL and the protrusion portion HWP may be thinner than the bulk electrode HWB. The protrusion portion HWP may be covered by the inner space LI of the low work function electrode LWG32. The inner space LI of the low work function electrode LWG32 may include a sloped inner surface and a flat inner surface. Here, the flat inner surfaces may be vertical flat inner surfaces extending along the first direction D1, and the inclined inner surfaces may be inner surfaces extending along the directions inclined in the first direction D1 and the second direction D2. The protrusion portion HWP may fill the inner space LI of the low work function electrode LWG32 without a void.

The bulk electrode HWB may include a metal material, and the barrier electrode HWL may include a metal nitride. For example, the bulk electrode HWB may be tungsten, and the barrier electrode HWL and the protrusion portion HWP may be titanium nitride. The low work function electrode LWG32 may be N-type polysilicon.

A method of forming the low work function electrode LWG including the inclined inner surface may be similar to the methods illustrated FIGS. 8E and 8F. For example, after conformally depositing the low work function material 20 in FIG. 8E, selective etching of the low work function material 20 may be performed as shown in FIG. 8F.

Figure 14:
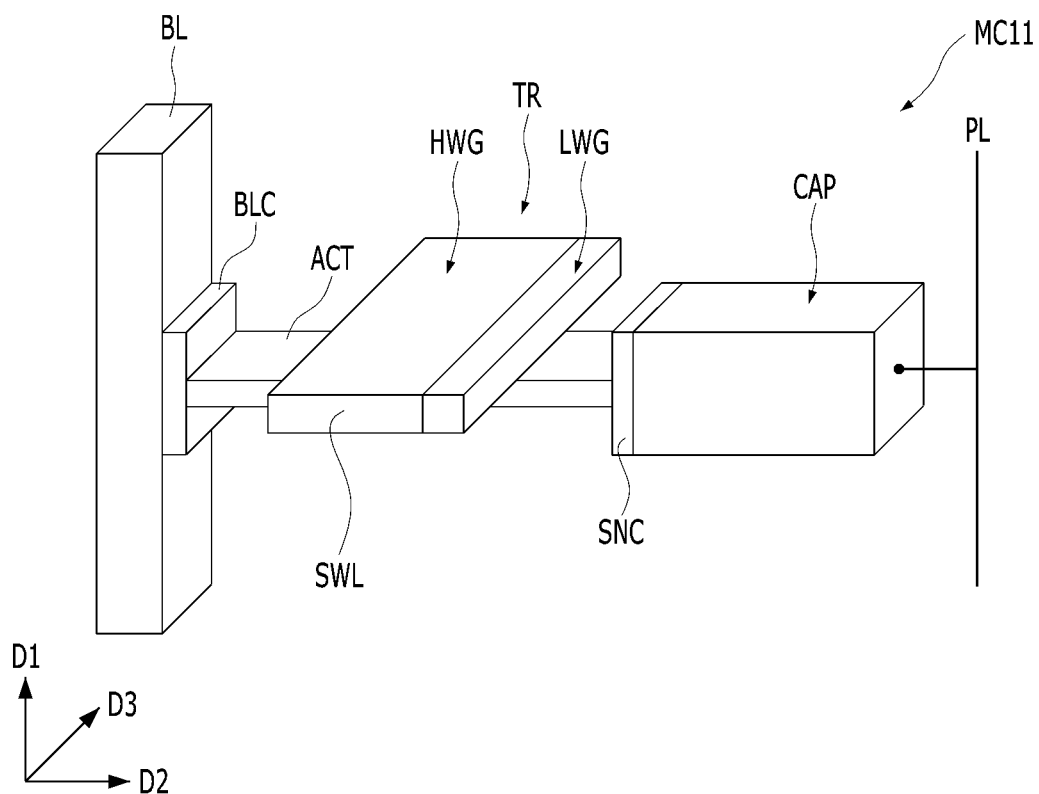
FIG. 14 is a schematic perspective view illustrating a memory cell according to another embodiment of the present invention.

FIG. 14 is a schematic perspective view illustrating a memory cell according to another embodiment. The components of the memory cell MC11 of FIG. 14 except for the single word line SWL may be similar to those of the memory cell MC of FIGS. 1 and 2.

Referring to FIG. 14, the memory cell MC11 of the 3D semiconductor memory device may include a bit line BL, a transistor TR, and a capacitor CAP. The transistor TR may include an active layer ACT and a single word line SWL. The single word line SWL may be formed on one of the upper and lower surfaces of the active layer ACT. The single word line SWL may include a low work function electrode LWG and a high work function electrode HWG. The low work function electrode LWG may be adjacent to the capacitor CAP, and the high work function electrode HWG may be adjacent to the bit line BL.

The memory cell MC11 may include a gate dielectric layer. Similar to that in FIG. 2, a gate dielectric layer GD may be formed between the single word line SWL and the active layer ACT, and the gate dielectric layer GD may include a first gate dielectric layer GD1 and a second gate dielectric layer GD2. The thicker first gate dielectric layer GD1 may be formed between the low work function electrode LWG and the active layer ACT of the single word line SWL. The thinner second gate dielectric layer GD2 may be formed between the high work function electrode HWG and the active layer ACT of the single word line SWL.

In another embodiment, the memory cell MC11 may constitute a memory cell array as shown in FIG. 3.

Figure 15:
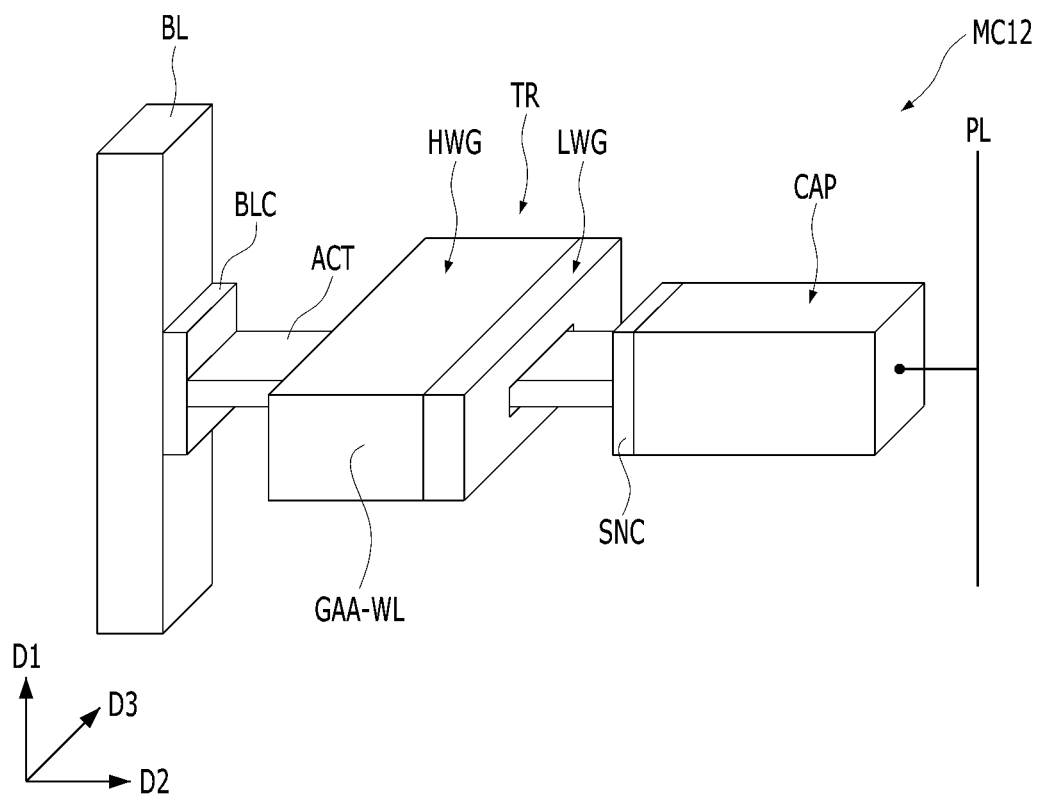
FIG. 15 is a schematic perspective view illustrating a memory cell according to another embodiment of the present invention.

FIG. 15 is a schematic perspective view of a memory cell according to another embodiment. The components of the memory cell MC12 of FIG. 15 may be similar to those of the memory cell MC of FIGS. 1 and 2 except for the gate all-around word line GAA-WL.

Referring to FIG. 15, the memory cell MC12 of the 3D semiconductor memory device may include a bit line BL, a transistor TR, and a capacitor CAP. The transistor TR may include an active layer ACT and a gate all-around word line GAA-WL. The gate all-around word line GAA-WL may extend along the third direction D3 while surrounding a portion (that is the channel) of the active layer ACT. The active layer ACT may have a shape penetrating the gate all-around word line GAA-WL. The gate all-around word line GAA-WL may include a low work function electrode LWG and a high work function electrode HWG. The low work function electrode LWG may be adjacent to the capacitor CAP, and the high work function electrode HWG may be adjacent to the bit line BL.

The memory cell MC12 may include a gate dielectric layer. For example, similar to that in FIG. 2, a gate dielectric layer GD may be formed between the gate all-around word line GAA-WL and the active layer ACT, and the gate dielectric layer GD may include a first insulating layer GD1 and a second gate dielectric layer GD2. The thicker first gate dielectric layer GD1 may be formed between the low work function electrode LWG of the gate all-around word line GAA-WL and the active layer ACT. The thinner second gate dielectric layer GD2 may be formed between the high work function electrode HWG of the gate all-around word line GAA-WL and the active layer ACT.

While the present invention disclosure has been described with respect to specific embodiments, it will be apparent to those skilled in the art that various changes and modifications may be made without departing from the spirit and scope of the present invention disclosure as defined in the following claims.

What is claimed is:

1. A semiconductor memory device, comprising:
 an active layer spaced apart from a substrate, extending in a direction parallel to the substrate, and including a channel, a source region, and a drain region;
 a bit line extending in a vertical direction to the substrate and contacting the source region of the active layer;
 a capacitor contacting the drain region of the active layer;
 a word line arranged in at least one of positions over and under the active layer, the word line including a high work function electrode which is arranged over or under the channel and a part of the source region and a low work function electrode which is arranged over or under a part of the drain region, the low work function electrode having a lower work function than the high work function electrode;
 a first gate dielectric layer disposed between the low work function electrode and the active layer; and
 a second gate dielectric layer disposed between the high work function electrode and the active layer, the second gate dielectric layer being thinner than the first gate dielectric layer.

2. The semiconductor memory device of claim 1, wherein the low work function electrode has a lower work function than a mid-gap work function of silicon, and the high work function electrode has a higher work function than the mid-gap work function of silicon.

3. The semiconductor memory device of claim 1, wherein the low work function electrode includes an N-type doped polysilicon.

4. The semiconductor memory device of claim 1, wherein the high work function electrode includes a metal-base material.

5. The semiconductor memory device of claim 1, wherein the high work function electrode includes titanium nitride, tungsten, or a stack of titanium nitride and tungsten.

6. The semiconductor memory device of claim 1, wherein the high work function electrode has a greater volume than the low work function electrode.

7. The semiconductor memory device of claim 1, wherein each of the high work function electrode and the low work function electrode vertically overlap with the active layer.

8. The semiconductor memory device of claim 1, wherein an overlapping area between the high work function electrode and the active layer is greater than an overlapping area between the low work function electrode and the active layer.

9. The semiconductor memory device of claim 1, wherein the channel of the active layer includes a thin-body channel which is thinner than the high work function electrode and thinner than the low work function electrode.

10. The semiconductor memory device of claim 1, wherein the active layer includes at least one of a semiconductor material and an oxide semiconductor material.

11. The semiconductor memory device of claim 1, wherein the active layer includes one or more of polysilicon, germanium, silicon-germanium, and IGZO (Indium Gallium Zinc Oxide).

12. The semiconductor memory device of claim 1, wherein the channel is arranged between the source region and the drain region.

13. The semiconductor memory device of claim 12, further including:
 a bit line contact node between the bit line and the first source/drain region; and
 a storage contact node between the capacitor and the second source/drain region.

14. The semiconductor memory device of claim 1, further including a word line pad contacting at least two word lines which are separated from each other and vertically stacked over the substrate.

15. The semiconductor memory device of claim 1, wherein the capacitor includes a cylindrical storage node contacting the drain region of the active layer.

16. The semiconductor memory device of claim 1, wherein the capacitor includes a cylindrical storage node contacting the drain region of the active layer, a dielectric layer on the storage node, and a plate node on the dielectric layer.

17. The semiconductor memory device of claim 1, wherein the word line includes a double word line.

18. The semiconductor memory device of claim 1, wherein the first gate dielectric layer and the second gate dielectric layer include the same material.

19. The semiconductor memory device of claim 1, wherein each of the first gate dielectric layer and the second gate dielectric layer includes silicon oxide, silicon nitride, metal oxide, metal oxynitride, metal silicate, high-k material, ferroelectric material, anti-ferroelectric material, or a combination thereof.

20. The semiconductor memory device of claim 1, wherein
 the low work function electrode includes an inner space, the high work function electrode includes a body portion and a protrusion portion, the protrusion portion protruding from the body portion, and the protrusion portion of the high work function electrode fills the inner space of the low work function electrode.

21. The semiconductor memory device of claim 20, wherein the body portion and the protrusion portion include a metal-base material.

22. The semiconductor memory device of claim 1, wherein the low work function electrode includes an inner space, the high work function electrode includes a bulk electrode and a barrier electrode, the barrier electrode covering a portion of the bulk electrode, and the barrier electrode includes a protrusion portion filling the inner space of the low work function electrode.

23. The semiconductor memory device of claim 22, wherein the bulk electrode includes tungsten, and the barrier electrode includes titanium nitride.

24. The semiconductor memory device of claim 22, wherein the inner space of the low work function electrode includes a flat inner surface, an inclined inner surface, or a combination thereof.

* * * * *